United States Patent
Kakehata et al.

(10) Patent No.: US 9,837,300 B2
(45) Date of Patent: Dec. 5, 2017

(54) METHOD FOR MANUFACTURING SOI SUBSTRATE

(75) Inventors: Tetsuya Kakehata, Kanagawa (JP); Kazutaka Kuriki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 720 days.

(21) Appl. No.: 13/467,082

(22) Filed: May 9, 2012

(65) Prior Publication Data

US 2012/0282757 A1    Nov. 8, 2012

Related U.S. Application Data

(60) Division of application No. 12/692,768, filed on Jan. 25, 2010, now Pat. No. 8,207,045, which is a continuation of application No. 12/259,833, filed on Oct. 28, 2008, now Pat. No. 7,696,058.

(30) Foreign Application Priority Data

Oct. 31, 2007   (JP) .................................. 2007-283669

(51) Int. Cl.
H01L 21/58    (2006.01)
H01L 21/762   (2006.01)

(52) U.S. Cl.
CPC ..... H01L 21/76254 (2013.01); *Y10S 438/977* (2013.01)

(58) Field of Classification Search
CPC .................. H01L 21/02038; H01L 21/76254
USPC ................................ 438/458, 406, FOR. 222
See application file for complete search history.

(56) References Cited

U.S. PATENT DOCUMENTS

| | | | |
|---|---|---|---|
| 5,953,622 A | 9/1999 | Lee et al. | |
| 6,284,629 B1 | 9/2001 | Yokokawa et al. | |
| 6,372,609 B1 | 4/2002 | Aga et al. | |
| 6,376,336 B1 | 4/2002 | Buynoski | |

(Continued)

FOREIGN PATENT DOCUMENTS

| | | |
|---|---|---|
| CN | 1290028 A | 4/2001 |
| EP | 1045448 A1 | 10/2000 |

(Continued)

OTHER PUBLICATIONS

Office Action, Chinese Application No. 200810173827.7, dated Nov. 5, 2012, 16 pages with full English translation.

*Primary Examiner* — George Fourson, III
(74) *Attorney, Agent, or Firm* — Fish & Richardson P.C.

(57) ABSTRACT

A semiconductor substrate and a base substrate are prepared; an oxide film is formed over the semiconductor substrate; the semiconductor substrate is irradiated with accelerated ions through the oxide film to form a separation layer at a predetermined depth from a surface of the semiconductor substrate; a nitrogen-containing layer is formed over the oxide film after the ion irradiation; the semiconductor substrate and the base substrate are disposed opposite to each other to bond a surface of the nitrogen-containing layer and a surface of the base substrate to each other; and the semiconductor substrate is heated to cause separation along the separation layer, thereby forming a single crystal semiconductor layer over the base substrate with the oxide film and the nitrogen-containing layer interposed therebetween.

12 Claims, 18 Drawing Sheets

(56) References Cited

U.S. PATENT DOCUMENTS

| | | |
|---|---|---|
| 6,534,380 B1 | 3/2003 | Yamauchi et al. |
| 6,566,233 B2 | 5/2003 | Yokokawa et al. |
| 6,583,440 B2 | 6/2003 | Yasukawa |
| 6,716,721 B2 * | 4/2004 | Dietrich et al. ............. 438/455 |
| 6,818,921 B2 | 11/2004 | Yasukawa |
| 6,900,113 B2 | 5/2005 | Nakano et al. |
| 7,112,514 B2 | 9/2006 | Yasukawa |
| 7,268,051 B2 | 9/2007 | Couillard et al. |
| 7,420,147 B2 | 9/2008 | Faris |
| 7,479,442 B2 | 1/2009 | Noguchi et al. |
| 7,696,058 B2 * | 4/2010 | Kakehata et al. ............ 438/406 |
| 2001/0046746 A1 | 11/2001 | Yokokawa et al. |
| 2002/0070454 A1 | 6/2002 | Yasukawa |
| 2003/0201508 A1 | 10/2003 | Yasukawa |
| 2005/0269671 A1 * | 12/2005 | Faure et al. ................. 257/618 |
| 2006/0076559 A1 | 4/2006 | Faure et al. |
| 2007/0032040 A1 * | 2/2007 | Lederer ....................... 438/455 |
| 2007/0032043 A1 | 2/2007 | Endo et al. |
| 2007/0111468 A1 | 5/2007 | Xie et al. |
| 2007/0298589 A1 * | 12/2007 | Nishihata et al. ............ 438/459 |
| 2008/0305317 A1 | 12/2008 | Ito et al. |
| 2009/0023272 A1 * | 1/2009 | Nishihata et al. ............ 438/459 |
| 2009/0072343 A1 * | 3/2009 | Ohnuma et al. ............. 257/506 |
| 2009/0111244 A1 * | 4/2009 | Yamazaki et al. ............ 438/458 |

FOREIGN PATENT DOCUMENTS

| | | |
|---|---|---|
| EP | 1981064 A1 | 10/2008 |
| JP | 02-054532 A | 2/1990 |
| JP | 11-097379 A | 4/1999 |
| JP | 2000-124092 A | 4/2000 |
| JP | 2002-026007 A | 1/2002 |
| JP | 2002-170942 A | 6/2002 |
| JP | 2006-324530 A | 11/2006 |
| WO | 2007/024549 A1 | 3/2007 |

* cited by examiner

METHOD FOR MANUFACTURING SOI SUBSTRATE

CROSS-REFERENCE TO RELATED APPLICATIONS

This application is a divisional of U.S. application Ser. No. 12/692,768, filed Jan. 25, 2010, now allowed, which is a continuation of U.S. application Ser. No. 12/259,833, filed Oct. 28, 2008, now U.S. Pat. No. 7,696,058, which claims the benefit of a foreign priority application filed in Japan as Ser. No. 2007-283669 on Oct. 31, 2007, all of which are incorporated by reference.

BACKGROUND OF THE INVENTION

1. Field of the Invention

The present invention relates to a method for manufacturing a silicon-on-insulator (SOI) substrate. The present invention also relates to a semiconductor device manufactured using the SOI substrate.

2. Description of the Related Art

In recent years, integrated circuits using a silicon-on-insulator (SOI) substrate where a thin single crystal semiconductor layer is present over an insulating surface, instead of using a bulk silicon wafer, have been developed. Because parasitic capacitance between a drain of a transistor and a substrate is reduced by use of an SOI substrate, SOI substrates are attracting attention as substrates which improve performance of semiconductor integrated circuits.

One of known methods for manufacturing SOI substrates is a Smart Cut (registered trademark) method (for example, see Reference 1: Japanese Published Patent Application No. 2000-124092). A summary of a method for manufacturing an SOI substrate by a Smart Cut method is described below. First, by implantation of hydrogen ions into a silicon wafer by an ion implantation method, an ion-implanted layer is formed at a predetermined depth from the surface. Next, the silicon wafer into which hydrogen ions are implanted is bonded to another silicon wafer with a silicon oxide film interposed therebetween. Then, through heat treatment, the ion-implanted layer serves as a cleavage plane and separation into a thin film occurs in the silicon wafer into which hydrogen ions are implanted. Accordingly, a single crystal silicon layer can be formed over the bonded silicon wafer. The Smart Cut method may also be referred to as an ion implantation separation method.

A method for forming a single crystal silicon layer over a supporting substrate made of glass by using such a Smart Cut method as described above has been proposed (for example, see Reference 2: Japanese Published Patent Application No. 2002-170942). Reference 2 discloses a bonding method in which a silicon nitride film is provided over a surface of one of a single crystal silicon substrate and a supporting substrate in order to prevent impurities in the supporting substrate from diffusing to a single crystal silicon layer side, and a silicon oxide film formed over the silicon nitride film is used as a bonding plane.

SUMMARY OF THE INVENTION

Glass substrates may have larger sizes and are less expensive than silicon wafers; thus, glass substrates are mainly used for manufacture of liquid crystal display devices. By using a glass substrate as a base substrate, a large-sized inexpensive SOI substrate can be manufactured. In the case where a substrate containing an impurity, such as a glass substrate, is used as a base substrate, it is effective to use a silicon nitride film or a silicon nitride oxide film (hereinafter also referred to as a "silicon nitride film or the like") in order to prevent diffusion of the impurity contained in the base substrate.

However, in the case where a silicon nitride film or the like is formed by a CVD method or the like, the obtained film has an uneven surface or the like; thus, in the case where the silicon nitride film or the like is used as a bonding layer, defective bonding may occur in bonding a base substrate and a single crystal semiconductor substrate to each other. In addition, in the case where ions are added to a single crystal silicon substrate through a silicon nitride film or the like having an uneven surface, the surface of the silicon nitride film or the like is roughened as well as being uneven; thus, defective bonding may occur with high possibility in bonding a base substrate and a single crystal silicon substrate to each other. As a result, a single crystal silicon layer obtained over a base substrate may be defective, and an element such as a transistor that is manufactured using the single crystal silicon layer may have insufficient characteristics.

Therefore, a silicon oxide film having planarity is generally used as a bonding plane between a base substrate and a single crystal silicon substrate. In this case, there is an inevitable necessity to form a silicon oxide film after forming a silicon nitride film or the like. In addition, in the case where a silicon nitride film or the like is formed on a single crystal silicon substrate side, if the silicon nitride film or the like is formed in contact with silicon, characteristics of a transistor may be affected by interface state. Thus, there arises a necessity to provide an insulating film (for example, a silicon oxide film or the like) between the silicon substrate and the silicon nitride film or the like. This causes problems such as an increase in the number of steps and a restriction on a process. In manufacturing an SOI substrate, a cost reduction by simplification of a process or the like is important because a single crystal silicon substrate used is expensive. Moreover, as the number of insulating films stacked increases, reliability may decrease; for example, defective bonding may occur due to dust or an impurity which is generated with an increase in the number of steps.

In view of the aforementioned problems, it is an object of the present invention to reduce the occurrence of defective bonding between a base substrate and a semiconductor substrate even when a silicon nitride film or the like is used as a bonding layer. Another object is to provide a method for manufacturing an SOI substrate by which an increase in the number of steps can be suppressed.

According to one aspect of the present invention, a semiconductor substrate and a base substrate are prepared; an oxide film is formed over the semiconductor substrate; the semiconductor substrate is irradiated with accelerated ions through the oxide film to form a separation layer at a predetermined depth from a surface of the semiconductor substrate; a nitrogen-containing layer is formed over the oxide film after the ion irradiation; the semiconductor substrate and the base substrate are disposed opposite to each other to bond a surface of the nitrogen-containing layer and a surface of the base substrate to each other; and the semiconductor substrate is heated to cause separation along the separation layer, thereby forming a single crystal semiconductor layer over the base substrate with the oxide film and the nitrogen-containing layer interposed therebetween.

According to another aspect of the present invention, a semiconductor substrate and a base substrate are prepared; an oxide film is formed over the semiconductor substrate; the semiconductor substrate is irradiated with accelerated ions through the oxide film to form a separation layer at a predetermined depth from a surface of the semiconductor substrate; a nitrogen-containing layer is formed over the base substrate; the semiconductor substrate and the base substrate are disposed opposite to each other to bond a surface of the oxide film and a surface of the nitrogen-containing layer to each other; and the semiconductor substrate is heated to cause separation along the separation layer, thereby forming a single crystal semiconductor layer over the base substrate with the oxide film and the nitrogen-containing layer interposed therebetween.

According to another aspect of the present invention, the nitrogen-containing layer is formed by a plasma CVD method with introduction of a hydrogen gas at a substrate temperature equal to or higher than room temperature and equal to or lower than 350° C. Alternatively, a plasma CVD method can be performed with introduction of a silane gas and an ammonia gas in addition to a hydrogen gas.

According to another aspect of the present invention, there are steps of: preparing a base substrate and a semiconductor substrate which is provided with a nitrogen-containing layer over its surface with an oxide film interposed therebetween and provided with a separation layer at a predetermined depth; disposing the semiconductor substrate and the base substrate opposite to each other to bond a surface of the nitrogen-containing layer and a surface of the base substrate to each other; heating the semiconductor substrate to cause separation along the separation layer, thereby forming a single crystal semiconductor layer over the base substrate with the oxide film and the nitrogen-containing layer interposed therebetween. The nitrogen-containing layer is formed with introduction of a hydrogen gas at a substrate temperature of 350° C. or lower.

In this specification, average surface roughness ($R_a$) of a surface is obtained by expanding, into three dimensions, center line average roughness that is defined by JIS B 0601 so as to be able to apply it to a measurement surface. The $R_a$ can be expressed as an "average value of the absolute values of deviations from a reference surface to a specific surface" and is defined by the following formula (1).

$$R_a = \frac{1}{S_0} \int_{y1}^{y2} \int_{x1}^{x2} |f(x, y) - Z_0| \, dx \, dy \quad (1)$$

Note that, in Formula (1), $S_0$ represents the area of a measurement surface (a rectangular region which is defined by four points represented by the coordinates $(x_1,y_1)$, $(x_1, y_2)$, $(x_2,y_1)$, and $(x_2,y_2)$), and $Z_0$ represents average height of a measurement surface.

Further, root-mean-square surface roughness ($R_{ms}$) can be expressed as "square root of the average value of squares of deviations from the reference surface to the specific surface", and is defined by the following formula (2).

$$R_{ms} = \sqrt{\frac{1}{S_0} \int_{y1}^{y2} \int_{x1}^{x2} \{f(x, y) - Z_0\}^2 \, dx} \quad (2)$$

Moreover, maximum height difference (P-V) refers to a difference between the height $Z_{max}$ of the highest point and the height $Z_{min}$ of the lowest point in the measurement surface.

The term "semiconductor device" in this specification refers to devices in general that can operate by utilizing semiconductor characteristics, and an electro-optical device, a semiconductor circuit, and an electronic device are all included in the semiconductor device.

The term "display device" in this specification includes a light emitting device and a liquid crystal display device. A light emitting device includes a light emitting element, and a liquid crystal display device includes a liquid crystal element. A light emitting element includes, in its scope, an element whose luminance is controlled by a current or a voltage, and specifically includes an inorganic electroluminescent (EL) element, an organic EL element, and the like.

According to the present invention, in manufacturing an SOI substrate, the occurrence of defective bonding between a base substrate and a semiconductor substrate can be suppressed even when a silicon nitride film or the like is used as a bonding layer. In addition, according to the present invention, in manufacturing an SOI substrate, simplification of a process can be achieved.

BRIEF DESCRIPTION OF THE DRAWINGS

FIGS. 2A-1 to 2A-4, 2B, 2C, and 2D are diagrams showing an example of a method for manufacturing an SOI substrate of the present invention.

FIGS. 3A, 3B-1 to 3B-3, 3C, and 3D are diagrams showing an example of a method for manufacturing an SOI substrate of the present invention.

FIGS. 4A-1 to 4A-3, 4B-1 and 4B-2, 4C, and 4D are diagrams showing an example of a method for manufacturing an SOI substrate of the present invention.

DETAILED DESCRIPTION OF THE INVENTION

Figures 1, 1A:
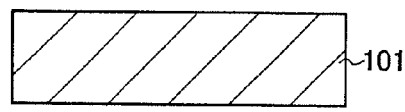
FIGS. 1A-1 to 1A-4, 1B, 1C, and 1D are diagrams showing an example of a method for manufacturing an SOI substrate of the present invention.

Embodiment modes and embodiments of the present invention will be hereinafter described based on the accompanying drawings. Note that the present invention can be carried out in many different modes, and it will be readily appreciated by those skilled in the art that modes and details of the present invention can be modified in various ways without departing from the sprit and scope thereof. Therefore, the present invention should not be interpreted as being limited to the description of the embodiment modes and embodiments. In the drawings for describing the embodiment modes and embodiments, the same reference numerals are commonly given to like components, and the components will not be described repeatedly.

(Embodiment Mode 1)

In this embodiment mode, an example of a method for manufacturing an SOI substrate of the present invention is described with reference to drawings.

First, a semiconductor substrate 101 is prepared (see FIG. 1A-1).

As the semiconductor substrate 101, a commercially available semiconductor substrate can be used. For example, a single crystal silicon substrate, a single crystal germanium substrate, or a compound semiconductor substrate of gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, and 12 inches (300 mm) in diameter. Note that the shape is not limited to a circular shape, and a silicon substrate processed into a rectangular shape or the like can also be used.

Figure 1B:
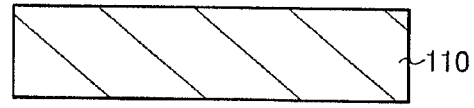
Figures 1, 1A, 2:
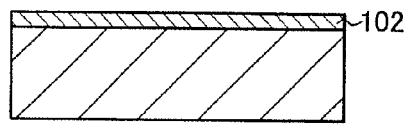

Next, an insulating film 102 is formed over a surface of the semiconductor substrate 101 (see FIG. 1A-2).

The insulating film 102 can be an oxide film such as a silicon oxide film ($SiO_x$) or a silicon oxynitride film ($Si-O_xN_y$) (x>y) formed by a CVD method, a sputtering method, or the like. Alternatively, the insulating film 102 may be an insulating film (such as a silicon oxide film) formed by thermal oxidation of a surface of the semiconductor substrate 101. Thermal oxidation may be performed by dry oxidation, but it is preferable that thermal oxidation be performed in an oxidizing atmosphere using a halogen-added gas. A typical example of the halogen-added gas is hydrogen chloride (HCl), and a kind or plural kinds of gases selected from HF, $NF_3$, HBr, $Cl_2$, $ClF_3$, $BCl_3$, $F_2$, $Br_2$, and the like can be used as well. When the oxide film is made to contain a halogen element, the oxide film can function as a protective layer which prevents contamination of the semiconductor substrate 101 by capturing impurities such as a metal. Furthermore, the insulating film 102 may be formed by treatment of a surface of the semiconductor substrate 101 with ozone water, hydrogen peroxide water, a sulfuric acid/hydrogen peroxide mixture, or the like.

In addition, it is preferable that the insulating film 102 be an insulating film having a smooth surface. For example, the insulating film 102 is formed to have a surface with an average surface roughness ($R_a$) of 0.5 nm or less and a root-mean-square surface roughness ($R_{ms}$) of 0.6 nm or less, preferably, an average surface roughness of 0.3 nm or less and a root-mean-square surface roughness of 0.4 nm or less.

When the insulating film 102 is formed by a CVD method, a silicon oxide film is preferably formed using organosilane as a source gas. This is because the insulating film 102 can have a flat surface when formed with a silicon oxide film using organosilane.

Examples of organosilane that can be used include silicon-containing compounds such as tetraethoxysilane (TEOS) (chemical formula: $Si(OC_2H_5)_4$), tetramethylsilane (TMS) (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

Moreover, a silicon oxide layer or a silicon oxynitride layer formed by a CVD method using silane as a source gas can be used.

Next, the semiconductor substrate 101 is irradiated with an ion beam 121 of ions that are accelerated by an electric field through the insulating film 102 to add the ions to a region at a predetermined depth from the surface of the semiconductor substrate 101, thereby forming a separation layer 103 (see FIG. 1A-3). The ion beam 121 is produced by generating plasma of a source gas and extracting ions included in the plasma from the plasma by the action of an electric field.

The depth of the region where the separation layer 103 is formed can be controlled by the accelerating energy of the ion beam 121 and the incidence angle thereof. The accelerating energy can be controlled by an acceleration voltage, a dosage, or the like. The separation layer 103 is formed in a region at the same or substantially the same depth as the average penetration depth of the ions. The thickness of a semiconductor layer separated from the semiconductor substrate 101 is determined by the depth at which the ions are added. The depth at which the separation layer 103 is formed is in the range of 10 nm to 500 nm, preferably, in the range of 50 nm to 200 nm.

Ions can be added to the semiconductor substrate 101 by an ion doping method which does not involve mass separation.

When hydrogen ($H_2$) is used for a source gas, plasma including $H^+$, $H_2^+$, and $H_3^+$ can be generated by excitation of a hydrogen gas. The proportion of ion species produced from the source gas can be changed by adjusting a plasma excitation method, pressure in an atmosphere for generating plasma, the amount of the source gas supplied, or the like.

$H_3^+$ has a larger number of hydrogen atoms and a larger mass than the other ions species ($H^+$, $H_2^+$). Thus, when accelerated with the same energy, $H_3^+$ is introduced to a shallower region of the semiconductor substrate 101 than $H^+$ and $H_2^+$. With a higher proportion of $H_3^+$ included in the ion beam 121, variation in the average penetration depth of hydrogen ions can be reduced. Thus, in the semiconductor substrate 101, the concentration profile of hydrogen in the depth direction becomes sharper and the peak of the profile can be positioned at a smaller depth. Therefore, in the case of using an ion doping method, it is preferable that the percentage of $H_3^+$ to the total amount of $H^+$, $H_2^+$, and $H_3^+$ that are included in the ion beam 121 be set to be 50% or higher, more preferably, 80% or higher.

In the case where a hydrogen gas is used and ions thereof are added by an ion doping method, the acceleration voltage can be set in the range of 10 kV to 200 kV and the dosage can be set in the range of $1\times10^{16}$ ions/cm$^2$ to $6\times10^{16}$ ions/cm$^2$. By addition of hydrogen ions under these conditions, the separation layer 103 can be formed in a region of the semiconductor substrate 101 at a depth of 50 nm to 500 nm, although depending on ion species included in the ion beam 121 and percentages thereof.

Helium (He) can also be used as the source gas of the ion beam 121. Most of ion species produced by excitation of helium is He$^+$; therefore, He can be mainly added to the semiconductor substrate 101 even by an ion doping method which does not involve mass separation. Accordingly, microvoids can be efficiently formed in the separation layer 103 by an ion doping method. In the case where helium is used and ions thereof are introduced by an ion doping method, the acceleration voltage can be set to be 10 kV to 200 kV and the dosage can be set to be $1\times10^{16}$ ions/cm$^2$ to $6\times10^{16}$ ions/cm$^2$. Note that an ion implantation method which involves mass separation may be used as a method for adding ions to the semiconductor substrate 101.

A halogen-containing gas such as a chlorine gas (Cl$_2$ gas) or a fluorine gas (F$_2$ gas) can also be used as the source gas.

By addition of ions to the semiconductor substrate 101 after formation of the insulating film 102 and before formation of a bonding layer, ions can be added to the semiconductor substrate 101 through the insulating film 102; thus, the separation layer 103 can be formed uniformly with respect to a depth direction. In particular, when the insulating film 102 is formed by oxidation of the semiconductor substrate 101, the insulating film 102 can be formed with a uniform thickness, and by addition of ions through the insulating film 102, uniformity of the separation layer 103 with respect to a depth direction can be improved. Furthermore, by addition of ions before formation of a bonding layer, a damaged layer (surface roughness) due to addition of ions can be prevented from being generated on a surface of the bonding layer, and defective bonding can be suppressed.

Next, a nitrogen-containing layer 104 (for example, a silicon nitride film (SiN$_x$) or a silicon nitride oxide film (SiN$_x$O$_y$) (x>y)) is formed over the insulating film 102 (see FIG. 1A-4).

In this embodiment mode, the nitrogen-containing layer 104 functions as a layer bonded to a base substrate (as a bonding layer). In addition, when a semiconductor layer having a single crystal structure (hereinafter referred to as a "single crystal semiconductor layer") is provided over a base substrate later, the nitrogen-containing layer 104 also functions as a barrier layer for preventing impurities such as mobile ions or moisture contained in the base substrate from diffusing into the single crystal semiconductor layer.

Because the nitrogen-containing layer 104 functions as a bonding layer as described above, it is necessary to use an insulating film having a smooth surface as the nitrogen-containing layer 104 in order to suppress defective bonding. Therefore, the nitrogen-containing layer 104 of this embodiment mode is formed to have a surface with an average surface roughness (R$_a$) of 0.5 nm or less and a root-mean-square surface roughness (R$_{ms}$) of 0.60 nm or less, preferably, an average surface roughness of 0.35 nm or less and a root-mean-square surface roughness of 0.45 nm or less. The thickness is preferably in the range of 10 nm to 200 nm, more preferably, 50 nm to 100 nm.

In addition, because hydrogen bonding greatly contributes to bonding with a base substrate, the nitrogen-containing layer 104 is formed to contain hydrogen. By use of a silicon nitride film or a silicon nitride oxide film containing hydrogen as the nitrogen-containing layer 104, it is possible to form strong bond with a base substrate such as a glass substrate by hydrogen bonding using Si—H, Si—OH, N—H, and N—OH bonds.

In order to form the nitrogen-containing layer 104 as described above, it is preferable in this embodiment mode that a silicon nitride film or a silicon nitride oxide film be formed by a plasma CVD method at a substrate temperature during film formation equal to or higher than room temperature and equal to or lower than 350° C., more preferably, equal to or higher than room temperature and equal to or lower than 300° C. When the substrate temperature during film formation is low, the nitrogen-containing layer 104 can be formed to have less surface roughness. This is because as the substrate temperature during film formation becomes higher, etching reaction on a deposition surface of a film due to hydrogen radicals or the like becomes excessive and surface roughness is generated. Note that "room temperature" refers to room temperature in a clean room used for manufacture of normal semiconductor devices and is 25° C. in this specification.

In this embodiment mode, film formation is performed by a plasma CVD method using at least a silane gas, an ammonia gas, and a hydrogen gas. By use of an ammonia gas and a hydrogen gas, the nitrogen-containing layer 104 which contains hydrogen in itself can be obtained. By film formation with introduction of a hydrogen gas, the nitrogen-containing layer 104 can be made to contain a large amount of hydrogen. Furthermore, when the substrate temperature during film formation is low, there are also advantages in that dehydrogenation reaction during film formation can be suppressed and the amount of hydrogen contained in the nitrogen-containing layer 104 can be increased. As a result, strong bond with a base substrate can be achieved.

The nitrogen-containing layer 104 which is obtained by a plasma CVD method at a low substrate temperature during film formation contains a large amount of hydrogen and has low density (or is soft). The nitrogen-containing layer 104 having low density can be densified (hardened) by heat treatment; thus, the thickness of the nitrogen-containing layer 104 can be decreased through the heat treatment.

Therefore, by bonding of the nitrogen-containing layer 104 having low density with a base substrate, even when a bonding plane on the base substrate side or the surface of the nitrogen-containing layer 104 is uneven, the unevenness can be absorbed by the nitrogen-containing layer 104. Thus, defective bonding can be suppressed. Moreover, by heat treatment performed at the same time as or after bonding, an element such as a transistor can be formed after the nitrogen-containing layer 104 is densified (hardened).

With the heat treatment, it is preferable to perform pressurization treatment. By pressurization treatment, unevenness of the bonding plane on the base substrate side or the surface of the nitrogen-containing layer 104 can be absorbed more effectively. Thus, defective bonding between the semiconductor substrate 101 and a base substrate can be suppressed.

In addition, when the substrate temperature during film formation of the nitrogen-containing layer 104 is low, degasification of the separation layer 103 formed in the semiconductor substrate 101 can be prevented from occurring. Note that heat treatment for separating a single crystal semiconductor layer from the semiconductor substrate 101 is performed at a higher temperature than the temperature at which the nitrogen-containing layer 104 is formed.

Next, a base substrate 110 is prepared (see FIG. 1B).

As the base substrate 110, a substrate having an insulating surface is used. Specific examples of the base substrate 110 include: a variety of glass substrates used in the electronics industry, such as substrates using aluminosilicate glass, aluminoborosilicate glass, and barium borosilicate glass; and plastic substrates each provided with a silicon oxide film or a silicon oxynitride film over its surface. A cost reduction can be achieved when a glass substrate or a plastic substrate which can have a larger size and is inexpensive is used as the base substrate 110.

When a glass substrate is used as the base substrate 110, a large-sized mother glass substrate of, for example, the sixth generation (1500 mm×1850 mm), the seventh generation (1870 mm×2200 mm), or the eighth generation (2200 mm×2400 mm) can be used. By use of a large-sized mother glass substrate as the base substrate 110 and by manufacture of an SOI substrate through bonding with a plurality of semiconductor substrates, the SOI substrate can have a larger size. As a result, the number of display panels which can be manufactured from a single substrate (panels yielded per substrate) can be increased, and accordingly, productivity can be improved.

It is preferable that the base substrate 110 have a smooth surface and be formed to have a surface with an average surface roughness ($R_a$) of 0.5 nm or less and a root-mean-square surface roughness ($R_{ms}$) of 0.6 nm or less, more preferably, an average surface roughness of 0.3 nm or less and a root-mean-square surface roughness of 0.4 nm or less. In the case where a glass substrate is used as the base substrate 110, polishing treatment may be performed on the surface of the glass substrate in advance, for example.

Figures 1, 1A, 2, 3:
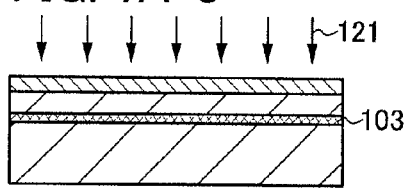
Figures 1, 1A, 2, 3, 4:
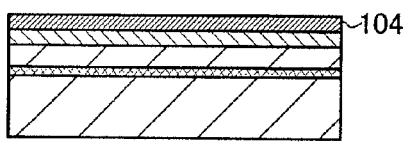
Figure 1C:
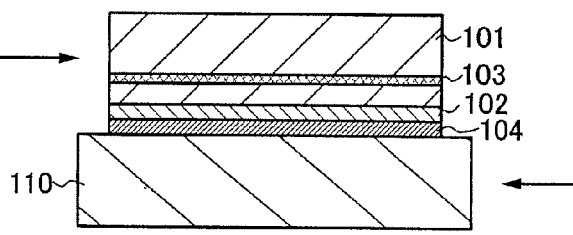

Next, the semiconductor substrate 101 and the base substrate 110 are bonded together (see FIG. 1C). Bond is formed by disposing the surface of the nitrogen-containing layer 104 that is formed over the semiconductor substrate 101 and functions as a bonding layer close to the surface of the base substrate 110. This bond is formed under the action of a van der Waals force, and by pressing of the base substrate 110 and the semiconductor substrate 101 against each other, strong bond can be formed by hydrogen bonding using Si—H, Si—OH, N—H, and N—OH bonds.

Note that it is preferable that the bonding plane be cleaned by megasonic cleaning or by megasonic cleaning and cleaning with ozone water before the semiconductor substrate 101 and the base substrate 110 are bonded together because an organic substance or the like on the bonding plane can be removed and the surfaces can be made hydrophilic. In addition, the surface of the nitrogen-containing layer 104 may be subjected to plasma treatment to remove dust such as an organic substance on the surface of the nitrogen-containing layer 104.

Next, heat treatment is performed after the base substrate 110 and the semiconductor substrate 101 are bonded to each other with the nitrogen-containing layer 104 interposed therebetween (see FIG. 1C). By the heat treatment, bonding strength between the base substrate 110 and the semiconductor substrate 101 can be increased. In addition, by this heat treatment, the nitrogen-containing layer 104 can be densified.

With the heat treatment, it is preferable to perform pressurization treatment. Pressurization treatment is performed so that pressure is applied perpendicular to the bonding plane. By pressurization treatment, even when the surface of the base substrate 110 or the surface of the nitrogen-containing layer 104 is uneven, the unevenness can be absorbed by the nitrogen-containing layer 104 having low density. Thus, defective bonding between the semiconductor substrate 101 and the base substrate 110 can be suppressed effectively (see FIGS. 13A to 13D). Note that the heat treatment may be performed at a temperature equal to or lower than the allowable temperature limit of the base substrate 110, for example, at 200° C. to 600° C.

Figure 1D:
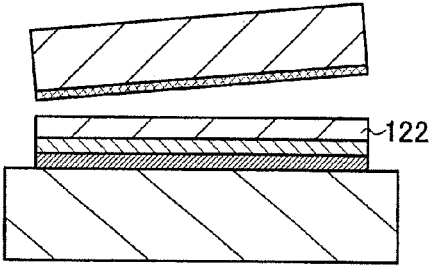

Next, a part of the semiconductor substrate 101 is separated from the base substrate 110 by using the separation layer 103 as a cleavage plane (see FIG. 1D). Here, heat treatment is performed at 400° C. to 600° C., whereby a change occurs in the volume of microvoids in the ions (for example, hydrogen ions) contained in the separation layer 103 and cleavage can be caused along the separation layer 103. As a result, a single crystal semiconductor layer 122 is left over the base substrate 110.

Note that when the heat treatment is performed using an apparatus that is capable of performing rapid heating, such as a rapid thermal annealing (RTA) apparatus, the heat treatment may be performed at a temperature higher than the strain point of the base substrate 110. The heat treatment performed in FIG. 1C and the heat treatment performed in FIG. 1D may be combined.

Through the above-described steps, an SOI substrate provided with the single crystal semiconductor layer 122 over the base substrate 110 with the insulating film 102 and the nitrogen-containing layer 104 interposed therebetween can be obtained.

By application of this embodiment mode, entry of impurities contained in a base substrate into a single crystal semiconductor layer can be suppressed, and occurrence of defective bonding between a base substrate and a semiconductor substrate can be suppressed. In addition, by use of a nitrogen-containing layer as a bonding layer, in manufacturing an SOI substrate, a process can be simplified, and a restriction on a process can be eliminated.

Note that the method for manufacturing an SOI substrate of this embodiment mode is not limited to the above-described method. For example, the separation layer 103 may be formed in a region at a predetermined depth from the surface of the semiconductor substrate 101 by addition of ions performed not before formation of the nitrogen-containing layer 104 but through the insulating film 102 and the nitrogen-containing layer 104 after formation of the nitrogen-containing layer 104 (see FIGS. 2A-1 to 2A-4, 2B, 2C, and 2D).

Figures 1, 2A:
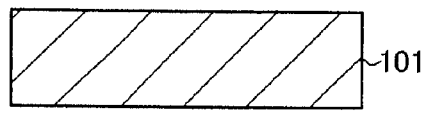
Figure 2B:
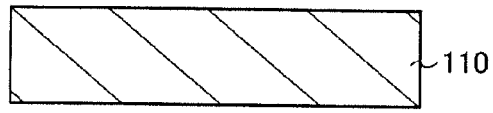
Figures 2, 2A:
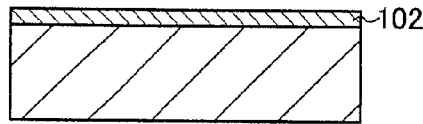
Figures 2, 2A, 3:
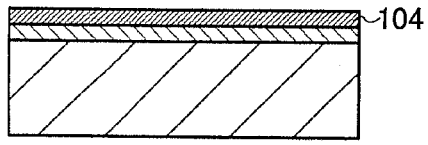
Figures 2, 2A, 3, 4:
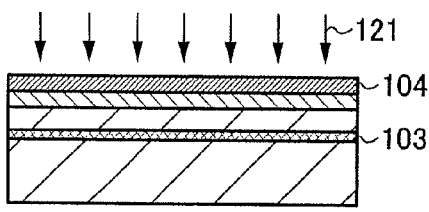
Figure 2C:
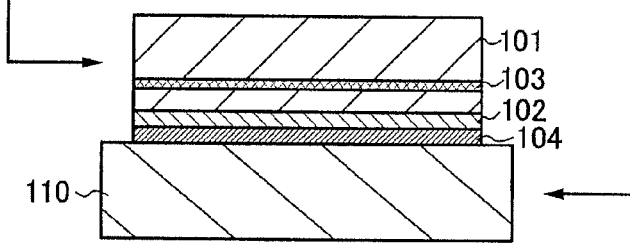
Figure 2D:
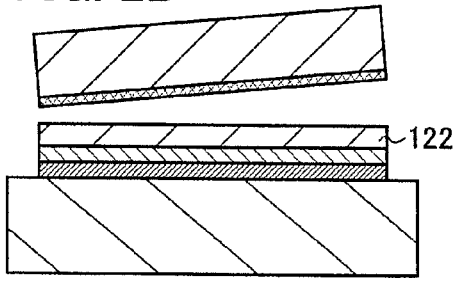

In this case, the insulating film 102 and the nitrogen-containing layer 104 can be formed successively (FIGS. 2A-2 and 2A-3). Accordingly, a manufacturing process can be shortened, or the interface between the insulating film 102 and the nitrogen-containing layer 104 can be cleaned. In FIGS. 2A-1 to 2A-4, 2B, 2C, and 2D, after the addition of ions (FIG. 2A-4), a part of the nitrogen-containing layer 104 may be etched to remove a damaged layer (surface roughness) generated on the surface of the nitrogen-containing layer 104 due to the introduction of the ions, and then the nitrogen-containing layer 104 may be bonded to the base substrate 110 (FIG. 2C).

Alternatively, the separation layer 103 may be formed in a region at a predetermined depth from the surface of the semiconductor substrate 101 by addition of ions performed before formation of the insulating film 102.

Although the case where the semiconductor substrate 101 is provided with the insulating film 102 and the nitrogen-containing layer 104 and is then bonded to the base substrate 110 is described in this embodiment mode, the base substrate 110 may be provided with the insulating film 102 and the nitrogen-containing layer 104 and may be then bonded to the semiconductor substrate 101 (see FIGS. 3A, 3B-1 to 3B-3, 3C, and 3D).

Figure 3A:
Figures 1, 3B:
Figures 2, 3B:
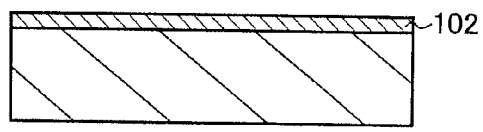
Figures 3, 3B:
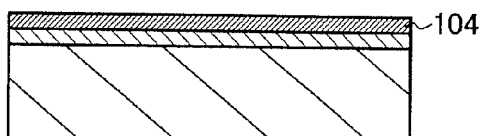
Figure 3C:
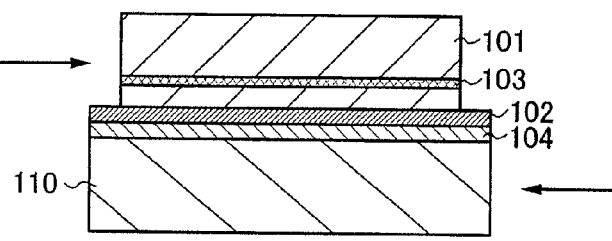
Figure 3D:
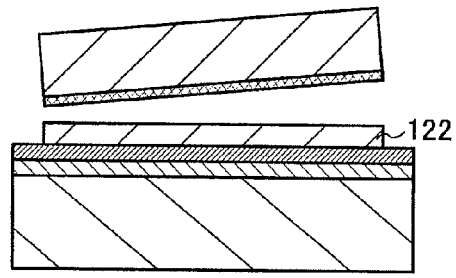

In this case, after the insulating film 102 and the nitrogen-containing layer 104 are formed over the base substrate 110 (FIGS. 3B-2 and 3B-3), the base substrate 110 and the semiconductor substrate 101 where the separation layer 103 is formed at a predetermined depth may be bonded to each other (FIG. 3C). Moreover, by successive formation of the insulating film 102 and the nitrogen-containing layer 104 over the base substrate 110, a manufacturing process can be shortened, or the interface between the insulating film 102 and the nitrogen-containing layer 104 can be cleaned.

Furthermore, in FIGS. 3A, 3B-1 to 3B-3, 3C, and 3D, a silicon oxide film may be formed over a surface of the semiconductor substrate 101, and the silicon oxide film formed over the semiconductor substrate 101 and the nitrogen-containing layer 104 formed on the base substrate 110 side may be bonded to each other.

Note that the method for manufacturing an SOI substrate of this embodiment mode can be appropriately combined with any of the manufacturing methods described in other embodiment modes of this specification.

(Embodiment Mode 2)

In this embodiment mode, a method for manufacturing an SOI substrate, which is different from that in the above-described embodiment mode, is described with reference to drawings. Specifically, a case is described in which a base substrate provided with a nitrogen-containing layer over its surface and a semiconductor substrate provided with an insulating film are bonded together.

Figures 1, 4A:
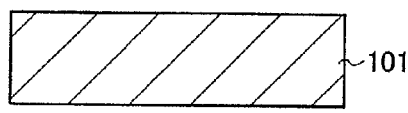

First, a semiconductor substrate 101 is prepared (see FIG. 4A-1), and an insulating film 202 is formed over a surface of the semiconductor substrate 101 (see FIG. 4A-2).

In this embodiment mode, the insulating film 202 functions as a bonding layer to a base substrate. The insulating film 202 can be a silicon oxide film ($SiO_x$) or a silicon oxynitride film ($SiO_xN_y$) (x>y) formed by a CVD method, a sputtering method, or the like. Alternatively, the insulating film 202 may be an insulating film (such as a silicon oxide film) formed by thermal oxidation of a surface of the semiconductor substrate 101. Thermal oxidation may be performed by dry oxidation, but it is preferable that thermal oxidation be performed in an oxidizing atmosphere using a halogen-added gas. A typical example of the halogen-added gas is HCl, and a kind or plural kinds of gases selected from HF, $NF_3$, HBr, $Cl_2$, $ClF_3$, $BCl_3$, $F_2$, $Br_2$, and the like can be used as well. When an oxide film is made to contain a halogen element, the oxide film can function as a protective layer which prevents contamination of the semiconductor substrate 101 by capturing impurities such as a metal. Furthermore, the insulating film 202 may be formed by treatment of a surface of the semiconductor substrate 101 with ozone water, hydrogen peroxide water, a sulfuric acid/hydrogen peroxide mixture, or the like.

The insulating film 202 may have either a single layer structure or a stacked layer structure, but it is preferable to use an insulating film whose surface to be bonded to a base substrate can be a planar hydrophilic surface. A silicon oxide film is suitable as the insulating film whose surface can be a planar hydrophilic surface. It is preferable that the silicon oxide film have an average surface roughness ($R_a$) of 0.5 nm or less and a root-mean-square surface roughness ($R_{ms}$) of 0.6 nm or less, more preferably, an average surface roughness of 0.3 nm or less and a root-mean-square surface roughness of 0.4 nm or less.

When the insulating film 202 is formed by a CVD method, a silicon oxide film is preferably formed using organosilane as a source gas. This is because the insulating film 202 can have a flat surface when formed with a silicon oxide film using organosilane.

Examples of organosilane that can be used include silicon-containing compounds such as tetraethoxysilane (TEOS) (chemical formula: $Si(OC_2H_5)_4$), tetramethylsilane (TMS) (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

Moreover, a silicon oxide layer or a silicon oxynitride layer formed by a CVD method using silane as a source gas can be used.

Next, the semiconductor substrate 101 is irradiated with an ion beam 121 of ions that are accelerated by an electric field through the insulating film 202 to introduce the ions to a region at a predetermined depth from the surface of the semiconductor substrate 101, thereby forming a separation layer 103 (see FIG. 4A-3). Note that Embodiment Mode 1 can be referred to for details of a method for forming the separation layer 103; thus, description thereof is omitted here.

Figures 1, 4B:
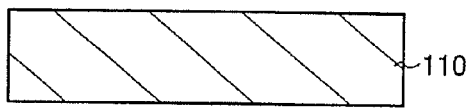
Figures 2, 4A:
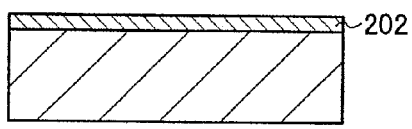
Figures 2, 4B:
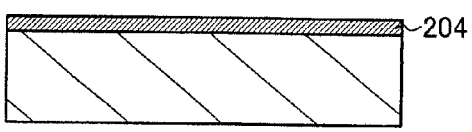
Figures 3, 4A:
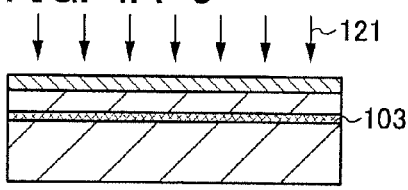

Next, a base substrate 110 is prepared (see FIG. 4B-1), and a nitrogen-containing layer 204 is formed over the base substrate 110 (see FIG. 4B-2).

The nitrogen-containing layer 204 functions as a layer to bond to the insulating film 202 formed over the semiconductor substrate 101, it is necessary to use an insulating film having a smooth surface. Therefore, it is preferable that the nitrogen-containing layer 204 in this embodiment mode be formed to have a surface with an average surface roughness ($R_a$) of 0.5 nm or less and a root-mean-square surface roughness ($R_{ms}$) of 0.60 nm or less, more preferably, an average surface roughness of 0.35 nm or less and a root-mean-square surface roughness of 0.45 nm or less. The thickness is preferably in the range of 10 nm to 200 nm, more preferably, 50 nm to 100 nm. When a single crystal semiconductor layer is provided over the base substrate 110 later, the nitrogen-containing layer 204 also functions as a barrier layer for preventing an impurity such as mobile ions or moisture contained in the base substrate 110 from diffusing into the single crystal semiconductor layer.

In addition, because hydrogen bonding greatly contributes to bonding with the base substrate 101, the nitrogen-containing layer 204 is formed to contain hydrogen. By use of a silicon nitride film or a silicon nitride oxide film containing hydrogen as the nitrogen-containing layer 204, it is possible to form strong bond with the insulating film 202 formed over the semiconductor substrate 101 by hydrogen bonding using Si—H, Si—OH, N—H, and N—OH bonds.

Note that Embodiment Mode 1 can be referred to for details of a method for forming the nitrogen-containing layer; thus, description thereof is omitted here.

Figure 4C:
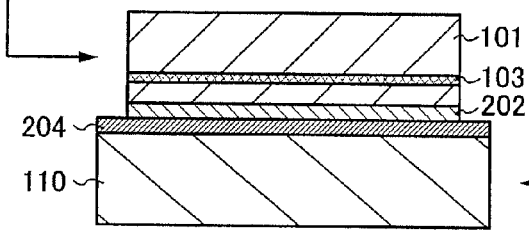

Next, the semiconductor substrate 101 and the base substrate 110 are bonded together (see FIG. 4C). Bond is formed by disposing the surface of the insulating film 202 that is formed over the semiconductor substrate 101 and functions as a bonding layer close to the surface of the nitrogen-containing layer 204 that is formed over the base substrate 110. This bond is formed under the action of a van der Waals force, and by pressing of the base substrate 110 and the semiconductor substrate 101 against each other, strong bond can be formed by hydrogen bonding using Si—H, Si—OH, N—H, and N—OH bonds.

Note that it is preferable that the bonding plane be cleaned by megasonic cleaning or by megasonic cleaning and cleaning with ozone water before the semiconductor substrate 101 and the base substrate 110 are bonded together because an organic substance or the like on the bonding plane can be removed and the surfaces can be made hydrophilic. In addition, the surface of the nitrogen-containing layer 204 may be subjected to plasma treatment to remove dust such as an organic substance on the surface of the nitrogen-containing layer 204.

Next, heat treatment is performed after the base substrate 110 and the semiconductor substrate 101 are bonded to each other with the insulating film 202 and the nitrogen-containing layer 204 interposed therebetween (see FIG. 4C). By the heat treatment, bonding strength between the base substrate 110 and the semiconductor substrate 101 can be increased. In addition, by this heat treatment, the nitrogen-containing layer 204 can be densified.

With the heat treatment, it is preferable to perform pressurization treatment. Pressurization treatment is performed so that pressure is applied perpendicular to the bonding plane. By pressurization treatment performed together with heat treatment, even when the surface of the insulating film 202 or the surface of the nitrogen-containing layer 204 is uneven, the unevenness can be absorbed by the nitrogen-containing layer 204 having low density. Thus, defective bonding between the semiconductor substrate 101 and the base substrate 110 can be suppressed effectively. The heat treatment may be performed at a temperature equal to or lower than the allowable temperature limit of the base substrate 110, for example, at 200° C. to 600° C.

Figure 4D:
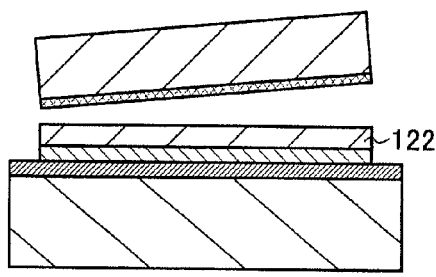

Next, a part of the semiconductor substrate 101 is separated from the base substrate 110 by using the separation layer 103 as a cleavage plane (see FIG. 4D). Here, heat treatment is performed at 400° C. to 600° C., whereby a change occurs in the volume of microvoids in the ions (for example, hydrogen ions) contained in the separation layer 103 and cleavage can be caused along the separation layer 103. As a result, a single crystal semiconductor layer 122 having the same crystallinity as the semiconductor substrate 101 is left over the base substrate 110.

Note that when the heat treatment is performed using an apparatus that is capable of performing rapid heating, such as a rapid thermal annealing (RTA) apparatus, the heat treatment may be performed at a temperature higher than the strain point of the base substrate 110. The heat treatment performed in FIG. 4C and the heat treatment performed in FIG. 4D may be combined.

Through the above-described steps, an SOI substrate provided with the single crystal semiconductor layer 122 over the base substrate 110 with the nitrogen-containing layer 204 and the insulating film 202 interposed therebetween can be obtained.

Note that the method for manufacturing an SOI substrate of this embodiment mode can be appropriately combined with any of the manufacturing methods described in other embodiment modes of this specification.

(Embodiment Mode 3)

In this embodiment mode, a method for manufacturing a semiconductor device using the SOI substrate manufactured in either one of the above-described embodiment modes is described.

First, as a method for manufacturing a semiconductor device, a method for manufacturing an n-channel thin film transistor and a p-channel thin film transistor is described with reference to FIGS. 5A to 5D and 6A to 6C. By combining a plurality of thin film transistors (TFTs), various types of semiconductor devices can be formed.

Figure 5A:
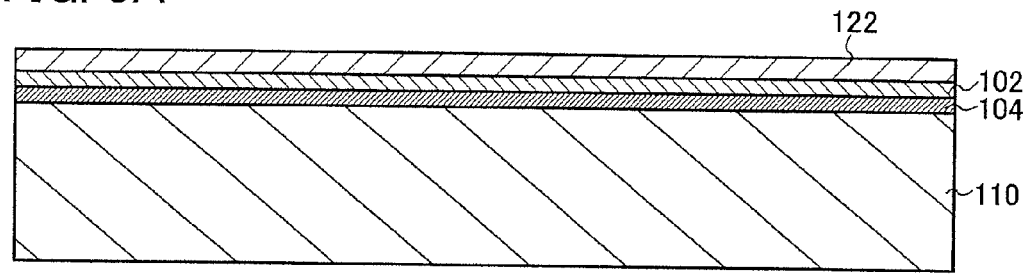
FIGS. 5A to 5D are diagrams showing an example of a method for manufacturing a semiconductor device using an SOI substrate of the present invention.

As an SOI substrate, the SOI substrate manufactured by the method of Embodiment Mode 1 is used here. FIG. 5A is a cross-sectional view of the SOI substrate manufactured by the method described with reference to FIGS. 1A-1 to 1A-4, 1B, 1C, and 1D.

Figure 5B:
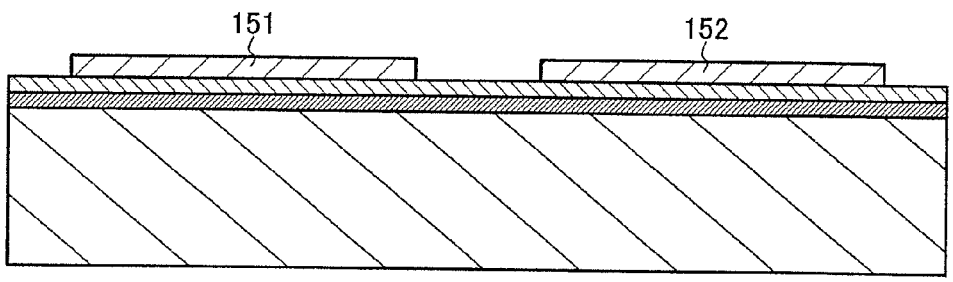

By element isolation of the single crystal semiconductor layer 122 of the SOI substrate by etching, semiconductor layers 151 and 152 are formed as shown in FIG. 5B. The semiconductor layer 151 is used for forming an n-channel TFT, and the semiconductor layer 152 is used for forming a p-channel TFT.

Figure 5C:
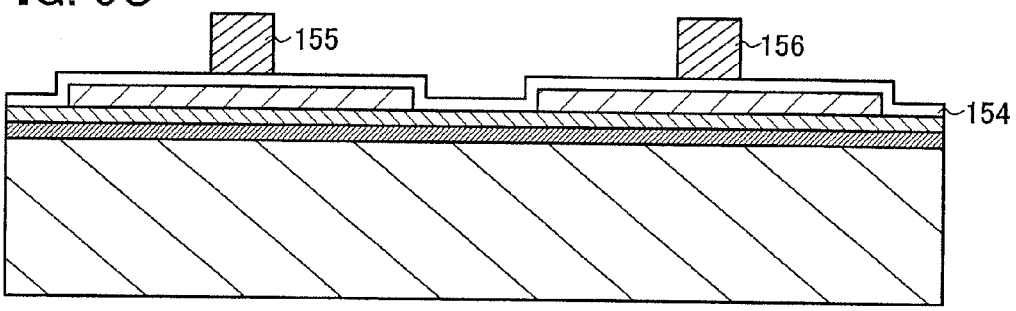

As shown in FIG. 5C, an insulating film 154 is formed over the semiconductor layers 151 and 152. Next, gate electrodes 155 and 156 are formed over the semiconductor layers 151 and 152 respectively with the insulating film 154 interposed therebetween.

Note that before the single crystal semiconductor layer 122 is etched, it is preferable to add an impurity element which serves as an acceptor, such as boron, aluminum, or gallium, or an impurity element which serves as a donor, such as phosphorus or arsenic, to the single crystal semiconductor layer 122 in order to control the threshold voltage of the TFTs. For example, an acceptor is added to a region where an n-channel TFT is to be formed, and a donor is added to a region where a p-channel TFT is to be formed.

Figure 5D:
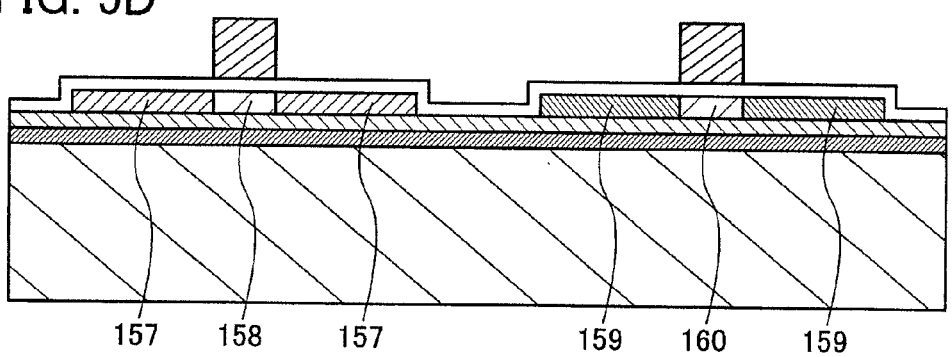

Next, as shown in FIG. 5D, n-type low-concentration impurity regions 157 are formed in the semiconductor layer 151, and p-type high-concentration impurity regions 159 are formed in the semiconductor layer 152. First, the n-type low-concentration impurity regions 157 are formed in the semiconductor layer 151. In order to form the n-type low-concentration impurity regions 157, the semiconductor layer 152 where a p-channel TFT is to be formed is covered with a resist mask, and a donor is added to the semiconductor layer 151. As the donor, phosphorus or arsenic may be added. When the donor is added by an ion doping method or an ion implantation method, the gate electrode 155 serves as a mask, and the n-type low-concentration impurity regions 157 are formed in the semiconductor layer 151 in a self-aligned manner. A region of the semiconductor layer 151 that overlaps with the gate electrode 155 serves as a channel formation region 158.

Next, after the mask which covers the semiconductor layer 152 is removed, the semiconductor layer 151 where an n-channel TFT is to be formed is covered with a resist mask. Then, an acceptor is added to the semiconductor layer 152 by an ion doping method or an ion implantation method. As the acceptor, boron can be added. In the step of adding the acceptor, the gate electrode 156 serves as a mask, and the p-type high-concentration impurity regions 159 are formed in the semiconductor layer 152 in a self-aligned manner. The high-concentration impurity regions 159 function as a source region and a drain region. A region of the semiconductor layer 152 that overlaps with the gate electrode 156 serves as a channel formation region 160. Here, the method is described in which the p-type high-concentration impurity regions 159 are formed after the n-type low-concentration impurity regions 157 are formed; however, the p-type high-concentration impurity regions 159 can be formed first.

Figure 6A:
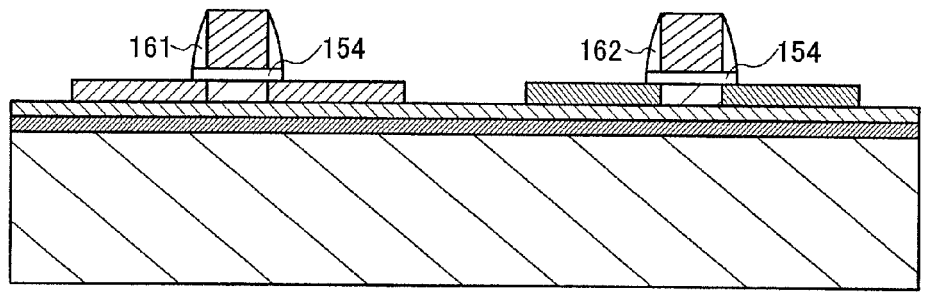
FIGS. 6A to 6C are diagrams showing an example of a method for manufacturing a semiconductor device using an SOI substrate of the present invention.

Next, after the resist that covers the semiconductor layer 151 is removed, an insulating film having a single layer structure or a stacked layer structure, which includes a nitrogen compound such as silicon nitride or an oxide such as silicon oxide, is formed by a plasma CVD method or the like. This insulating film is anisotropically etched in a perpendicular direction, whereby sidewall insulating films 161 and 162 are formed in contact with side surfaces of the gate electrodes 155 and 156 respectively, as shown in FIG. 6A. By this anisotropic etching, the insulating film 154 is also etched.

Figure 6B:
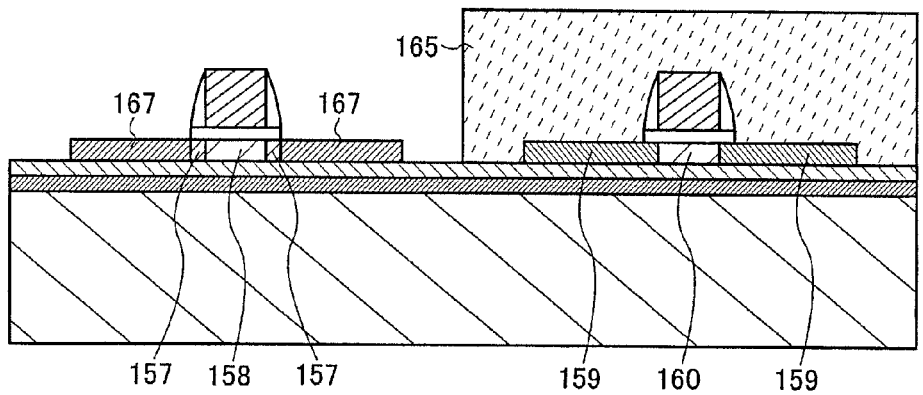

Next, as shown in FIG. 6B, the semiconductor layer 152 is covered with a resist 165. In order to form high-concentration impurity regions functioning as a source region and a drain region in the semiconductor layer 151, a donor is added to the semiconductor layer 151 at high dosage by an ion implantation method or an ion doping method. The gate electrode 155 and the sidewall insulating film 161 function as a mask, and n-type high-concentration impurity regions 167 are formed. Next, heat treatment for activating the donors and the acceptors is performed.

Figure 6C:
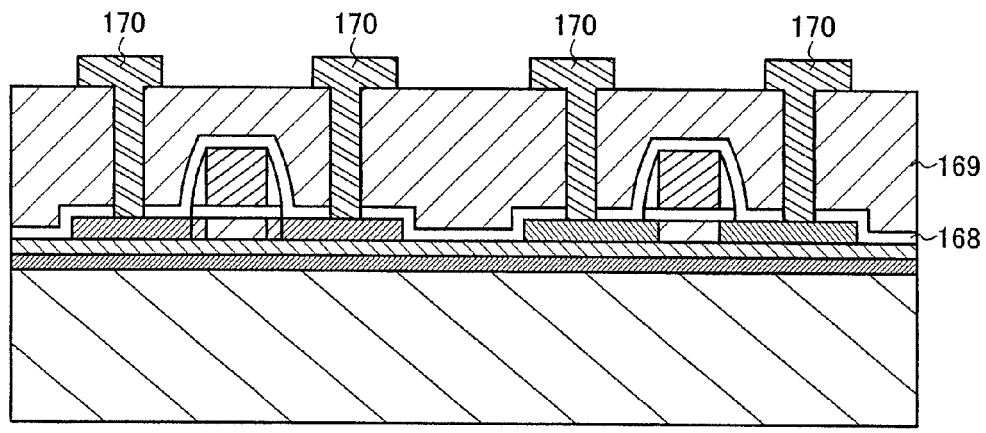

After the heat treatment for activation, an insulating film 168 containing hydrogen is formed as shown in FIG. 6C. After the insulating film 168 is formed, heat treatment is performed at a temperature of 350° C. to 450° C. so that hydrogen contained in the insulating film 168 diffuses into the semiconductor layers 151 and 152. The insulating film 168 can be formed by deposition of silicon nitride or silicon nitride oxide by a plasma CVD method at a process temperature of 350° C. or lower. By supply of hydrogen to the semiconductor layers 151 and 152, defects to serve as trapping centers in the semiconductor layers 151 and 152 or at the interface with the insulating film 154 can be compensated effectively.

After that, an interlayer insulating film 169 is formed. The interlayer insulating film 169 can be formed using a film having a single layer structure or a stacked layer structure selected from insulating films formed of inorganic materials, such as a silicon oxide film and a borophosphosilicate glass (BPSG) film, and organic resin films formed of polyimide, acrylic, and the like. Contact holes are formed in the interlayer insulating film 169, and wirings 170 are then formed as shown in FIG. 6C. The wirings 170 can be formed using a conductive film with a three-layer structure in which a low-resistance metal film such as an aluminum film or an aluminum-alloy film is sandwiched between barrier metal films. The barrier metal films can each be formed using a metal film of molybdenum, chromium, titanium, or the like.

Through the above-described steps, a semiconductor device having the n-channel TFT and the p-channel TFT can be manufactured. Because the metal element concentration of the semiconductor layer in which the channel formation region is formed is reduced in the manufacturing process of the SOI substrate, a TFT in which off current is small and variation of the threshold voltage is suppressed can be manufactured.

Although the method for manufacturing a TFT is described with reference to FIGS. 5A to 5D and 6A to 6C, a semiconductor device with high added value can be manufactured by forming a variety of semiconductor elements such as a capacitor and a resistor as well as a TFT. Hereinafter, specific modes of semiconductor devices will be described with reference to drawings.

Figure 7:
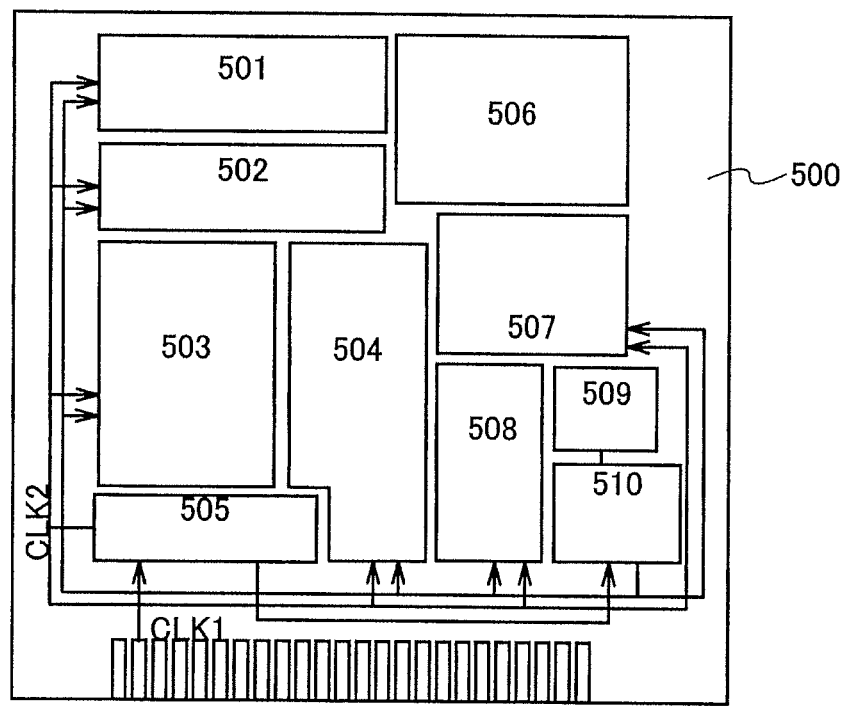
FIG. 7 is a diagram showing an example of a semiconductor device using an SOI substrate of the present invention.

First, a microprocessor is described as an example of a semiconductor device. FIG. 7 is a block diagram showing an example of a structure of a microprocessor 500.

The microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory 509, and a memory interface 510.

An instruction input to the microprocessor 500 through the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instruction.

The ALU controller 502 generates signals for controlling the operation of the ALU 501. The interrupt controller 504 is a circuit which processes an interrupt request from an external input/output device or a peripheral circuit while the microprocessor 500 is executing a program, and the interrupt controller 504 processes an interrupt request based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As shown in FIG. 7, the internal clock signal CLK2 is input to other circuits.

Figure 8:
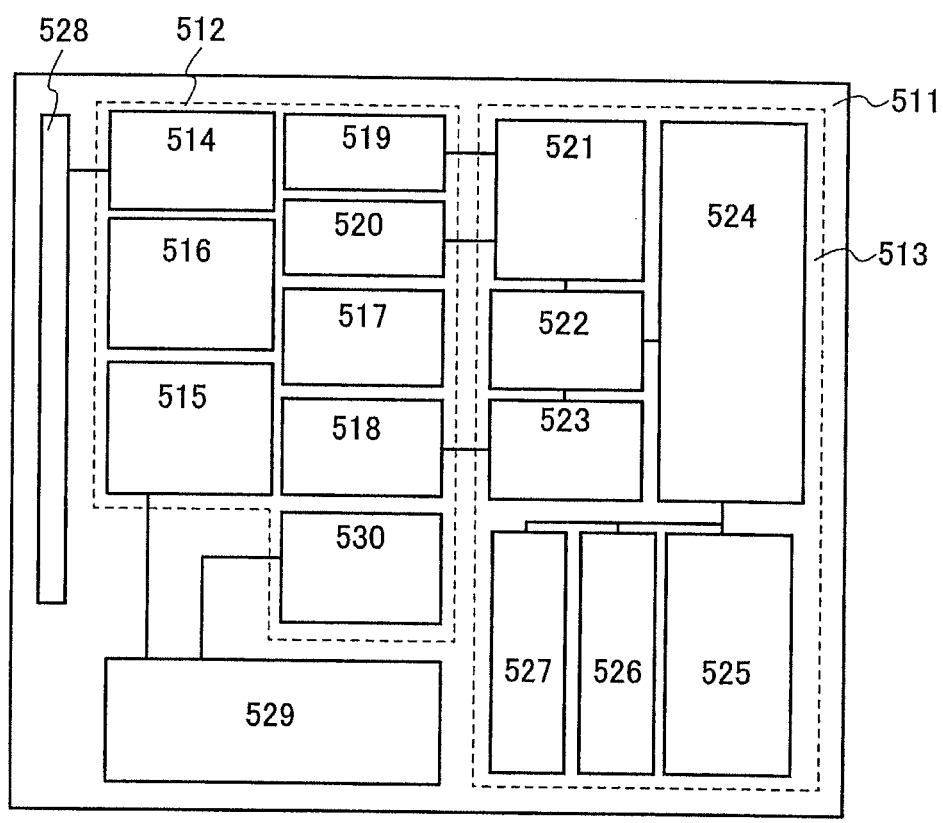
FIG. 8 is a diagram showing an example of a semiconductor device using an SOI substrate of the present invention.

Next, an example of a semiconductor device having an arithmetic function and a function for contactless data transmission and reception is described. FIG. 8 is a block diagram showing an example of a structure of such a semiconductor device. A semiconductor device shown in FIG. 8 can be called a computer that operates to transmit and receive signals to and from an external device by wireless communication (such a computer hereinafter referred to as an "RFCPU").

As shown in FIG. 8, an RFCPU 511 has an analog circuit portion 512 and a digital circuit portion 513. The analog circuit portion 512 has a resonance circuit 514 with a resonance capacitor, a rectifier circuit 515, a constant voltage circuit 516, a reset circuit 517, an oscillator circuit 518, a demodulator circuit 519, a modulator circuit 520, and a power management circuit 530. The digital circuit portion 513 has an RF interface 521, a control register 522, a clock controller 523, an interface 524, a central processing unit 525, a random-access memory 526, and a read-only memory 527.

The operation of the RFCPU 511 is roughly as follows. The resonance circuit 514 generates an induced electromotive force based on a signal received by an antenna 528. The induced electromotive force is stored in a capacitor portion 529 through the rectifier circuit 515. This capacitor portion 529 is preferably formed using a capacitor such as a ceramic capacitor or an electric double layer capacitor. The capacitor portion 529 does not need to be formed over a substrate included in the RFCPU 511 and can also be incorporated in the RFCPU 511 as a separate component.

The reset circuit 517 generates a signal for resetting and initializing the digital circuit portion 513. For example, the reset circuit 517 generates a signal which rises after rise in a power supply voltage with delay as a reset signal. The oscillator circuit 518 changes the frequency and duty ratio of a clock signal in response to a control signal generated by the constant voltage circuit 516. The demodulator circuit 519 is a circuit which demodulates a received signal, and the modulator circuit 520 is a circuit which modulates data to be transmitted.

For example, the demodulator circuit 519 is formed using a low-pass filter and binarizes a received amplitude-modulated (ASK) signal based on its amplitude. In order to vary the amplitude of an amplitude-modulated (ASK) transmission signal and transmit the signal, the modulator circuit 520 changes the amplitude of a communication signal by changing a resonance point of the resonance circuit 514.

The clock controller 523 generates a control signal for changing the frequency and duty ratio of a clock signal in accordance with the power supply voltage or a consumption current of the central processing unit 525. The power supply voltage is monitored by the power management circuit 530.

A signal input to the RFCPU 511 from the antenna 528 is demodulated by the demodulator circuit 519 and then decomposed into a control command, data, and the like by the RF interface 521. The control command is stored in the control register 522. The control command includes reading of data stored in the read-only memory 527, writing of data to the random-access memory 526, an arithmetic instruction to the central processing unit 525, and the like.

The central processing unit 525 accesses the read-only memory 527, the random-access memory 526, and the control register 522 via the interface 524. The interface 524 functions to generate an access signal for any of the read-only memory 527, the random-access memory 526, and the control register 522 based on an address the central processing unit 525 requests.

As an arithmetic method of the central processing unit 525, a method may be employed in which the read-only memory 527 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of arithmetic processing is conducted by a dedicated arithmetic circuit and the other part of the arithmetic processing is conducted by the central processing unit 525 using a program.

Next, display devices are described as semiconductor devices with reference to FIG. 9, FIGS. 10A and 10B, and FIGS. 11A and 11B.

In the manufacturing process of each of the SOI substrates described in Embodiment Modes 1 and 2, a glass substrate can be employed as the base substrate 110. Therefore, by using a glass substrate as the base substrate 110 and by bonding a plurality of semiconductor layers thereto, a large-sized SOI substrate of more than one meter on each side can be manufactured.

Figure 9:
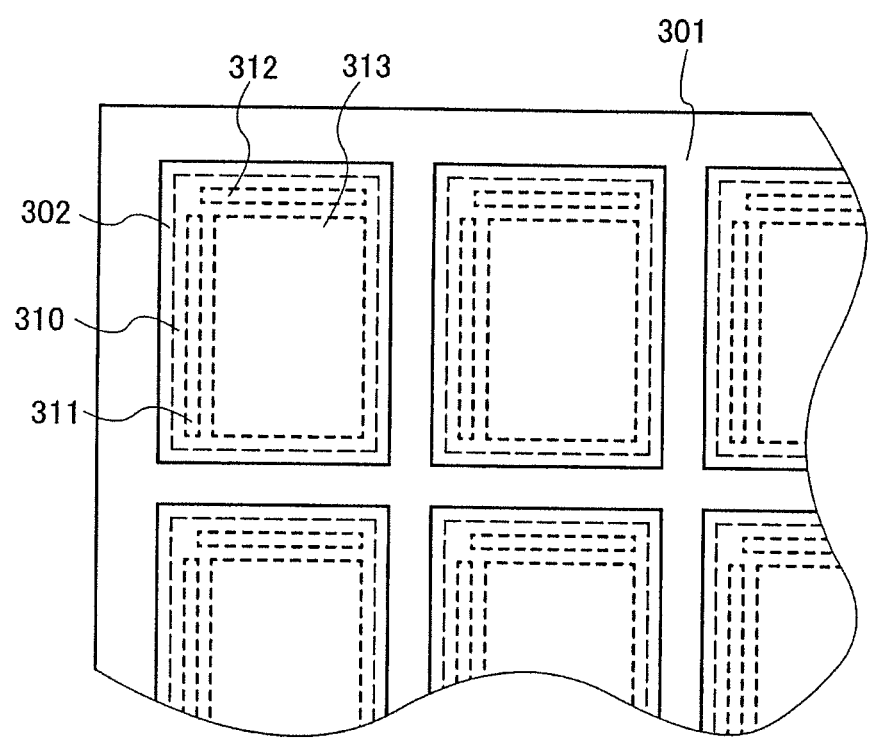
FIG. 9 is a diagram showing an example of a display device using an SOI substrate of the present invention.

A large-sized glass substrate called mother glass used for manufacture of display panels can be used as a base substrate of an SOI substrate. FIG. 9 is a front view of an SOI substrate in which mother glass is used as the base substrate 110. With a plurality of semiconductor elements formed using such a large-sized SOI substrate, a liquid crystal display device or an electroluminescent display device can be manufactured. In addition to such display devices, various kinds of semiconductor devices such as a solar cell, a photo IC, and a semiconductor memory device can be manufactured using an SOI substrate.

As shown in FIG. 9, single crystal semiconductor layers 302 which are separated from a plurality of semiconductor substrates are bonded to a single piece of mother glass 301. In order to cut out a plurality of display panels from the mother glass 301, display panel formation regions 310 are preferably included within the single crystal semiconductor layers 302. Each display panel includes a scan line driver circuit, a signal line driver circuit, and a pixel portion. Thus, each display panel formation region 310 has regions in which these are formed (a scan line driver circuit formation region 311, a signal line driver circuit formation region 312, and a pixel formation region 313).

Figure 10A:
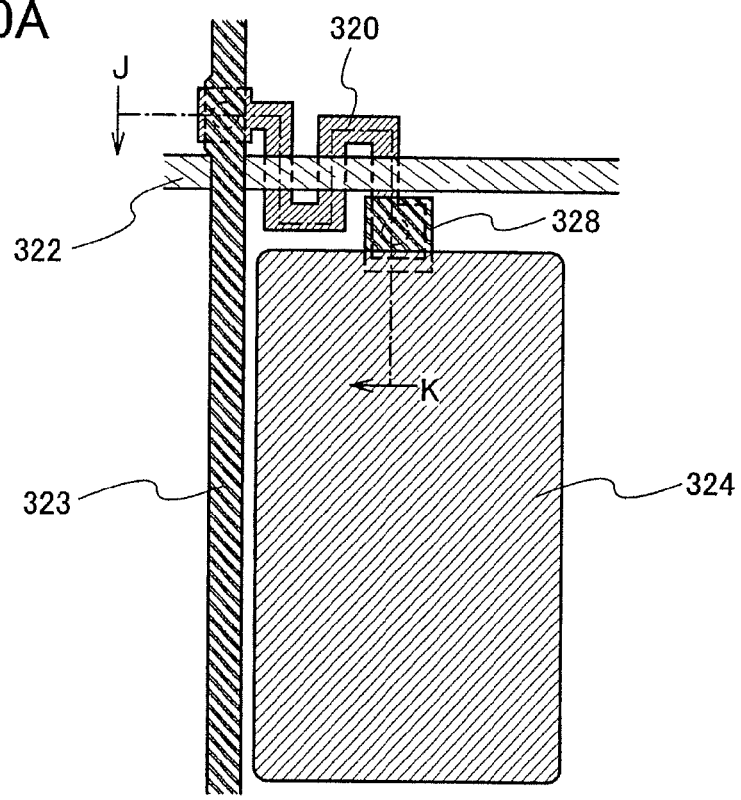
FIGS. 10A and 10B are diagrams showing an example of a display device using an SOI substrate of the present invention.
Figure 10B:
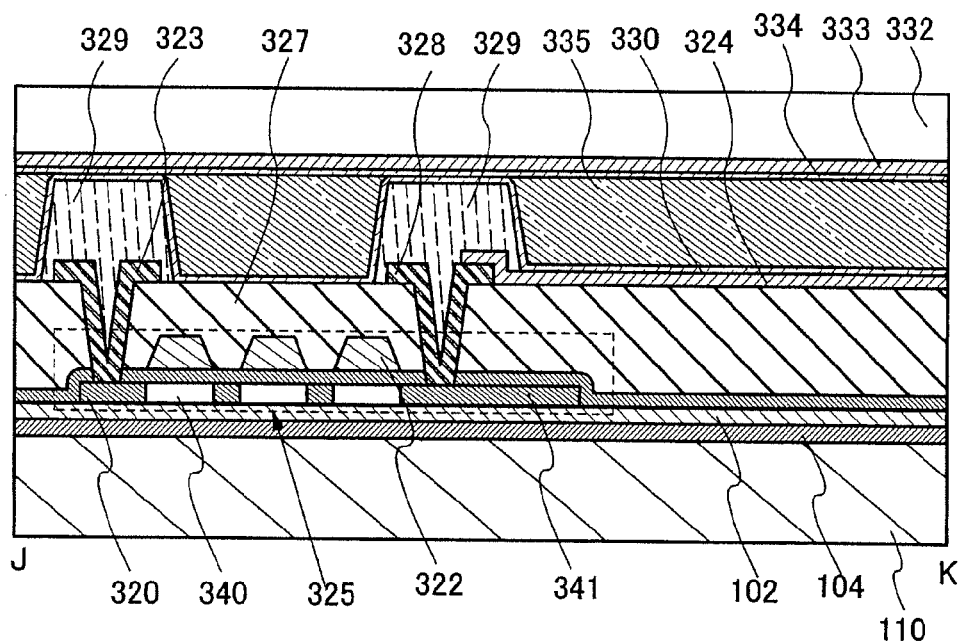

FIGS. 10A and 10B are drawings for describing a liquid crystal display device. FIG. 10A is a plan view of a pixel of the liquid crystal display device, and FIG. 10B is a cross-sectional view of FIG. 10A taken along a section line J-K.

As shown in FIG. 10A, the pixel includes a single crystal semiconductor layer 320, a scan line 322 intersecting with the single crystal semiconductor layer 320, a signal line 323 intersecting with the scan line 322, a pixel electrode 324, and an electrode 328 which electrically connects the pixel electrode 324 with the single crystal semiconductor layer 320. The single crystal semiconductor layer 320 is a layer formed of the single crystal semiconductor layer 302 bonded to the SOI substrate and is included in a TFT 325 of the pixel.

As the SOI substrate, the SOI substrate manufactured by the method of Embodiment Mode 1 is used. As shown in FIG. 10B, the nitrogen-containing layer 104, the insulating film 102, and the single crystal semiconductor layer 320 are stacked over the base substrate 110. The base substrate 110 is obtained by dividing the mother glass 301. The single crystal semiconductor layer 320 of the TFT 325 is formed by element isolation of the semiconductor layer of the SOI substrate by etching. In the single crystal semiconductor layer 320, channel formation regions 340 and n-type high-concentration impurity regions 341 to which a donor is added are formed. A gate electrode of the TFT 325 is included in the scan line 322, and one of a source electrode and a drain electrode is included in the signal line 323.

Over an interlayer insulating film 327, the signal line 323, the pixel electrode 324, and the electrode 328 are provided. Over the interlayer insulating film 327, columnar spacers 329 are formed. An orientation film 330 is formed to cover the signal line 323, the pixel electrode 324, the electrode 328, and the columnar spacers 329. On a counter substrate 332, a counter electrode 333 and an orientation film 334 that covers the counter electrode 333 are formed. The columnar spacers 329 are formed to maintain a space between the base substrate 110 and the counter substrate 332. In the space formed by the columnar spacers 329, a liquid crystal layer 335 is formed. At connection portions of the signal line 323 and the electrode 328 with the high-concentration impurity regions 341, there are steps formed in the interlayer insulating film 327 due to formation of contact holes; thus, orientation of liquid crystal in the liquid crystal layer 335 in these connection portions becomes disordered easily. Accordingly, the columnar spacers 329 are formed in these step portions to prevent orientation disorder of liquid crystal.

Figure 11A:
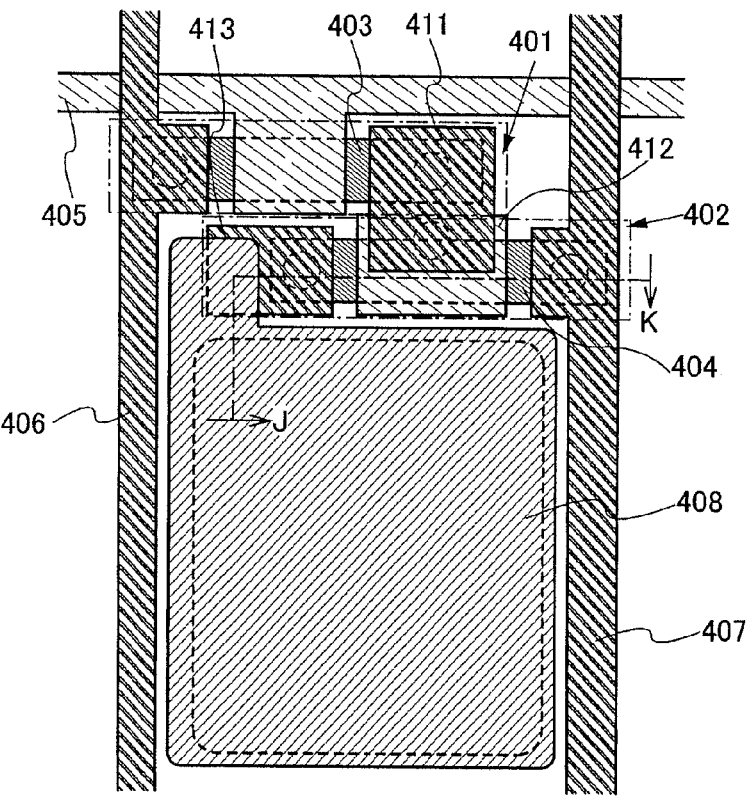
FIGS. 11A and 11B are diagrams showing an example of a display device using an SOI substrate of the present invention.
Figure 11B:
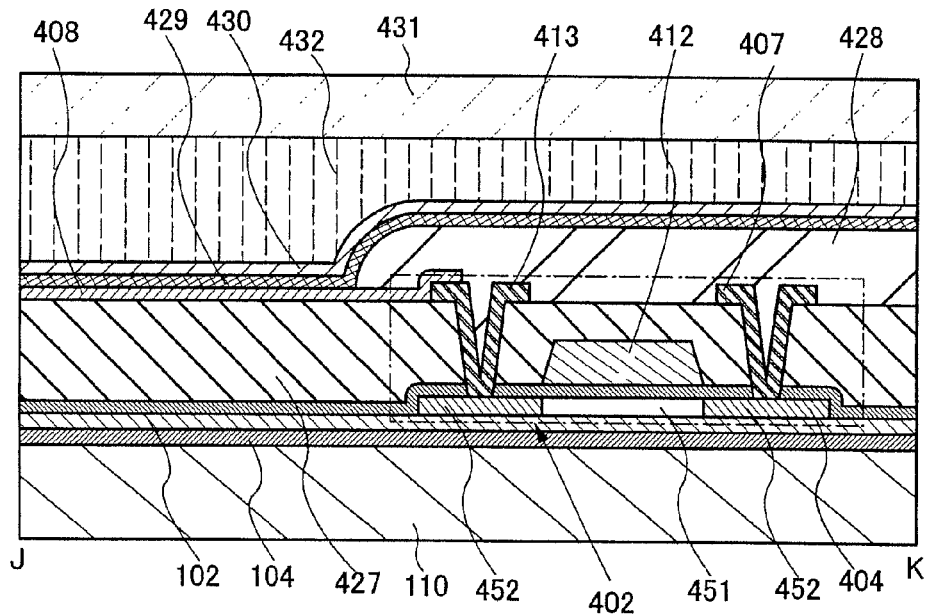

Next, an electroluminescent display device (hereinafter referred to as an "EL display device") is described with reference to FIGS. 11A and 11B. FIG. 11A shows a plan view of a pixel of the EL display device, and FIG. 11B shows a cross-sectional view of FIG. 11A taken along a section line J-K.

As shown in FIG. 11A, the pixel includes a selecting transistor 401 and a display control transistor 402 that are TFTs, a scan line 405, a signal line 406, a current supply line 407, and a pixel electrode 408. Each pixel is provided with a light emitting element having a structure in which a layer containing an electroluminescent material (EL layer) is interposed between a pair of electrodes. One of the electrodes of the light emitting element is the pixel electrode 408. In a semiconductor layer 403, a channel formation region, a source region, and a drain region of the selecting transistor 401 are formed. In a semiconductor layer 404, a channel formation region, a source region, and a drain region of the display control transistor 402 are formed. The semiconductor layers 403 and 404 are formed of the single crystal semiconductor layer 302 that is bonded to the SOI substrate.

In the selecting transistor 401, a gate electrode is included in the scan line 405; one of a source electrode and a drain electrode is included in the signal line 406; and the other is formed as an electrode 411. In the display control transistor 402, a gate electrode 412 is electrically connected to the electrode 411, and one of a source electrode and a drain electrode is formed as an electrode 413 that is electrically connected to the pixel electrode 408, and the other is included in the current supply line 407.

The display control transistor 402 is a p-channel TFT. As shown in FIG. 11B, in the semiconductor layer 404, a channel formation region 451 and p-type high-concentration impurity regions 452 are formed. Note that as the SOI substrate, the SOI substrate manufactured by the method of Embodiment Mode 1 is used.

An interlayer insulating film 427 is formed to cover the gate electrode 412 of the display control transistor 402. Over the interlayer insulating film 427, the signal line 406, the current supply line 407, the electrodes 411 and 413, and the like are formed. In addition, over the interlayer insulating film 427, the pixel electrode 408 that is electrically connected to the electrode 413 is formed. A peripheral portion of the pixel electrode 408 is surrounded by an insulating partition layer 428. An EL layer 429 is formed over the pixel electrode 408, and a counter electrode 430 is formed over the EL layer 429. A counter substrate 431 is provided as a reinforcing plate, and the counter substrate 431 is fixed to the base substrate 110 with a resin layer 432.

The grayscale of the EL display device is controlled by either a current drive method where the luminance of the light-emitting element is controlled by the amount of current or a voltage drive method where the luminance is controlled by the amount of voltage. The current drive method is difficult to adapt when transistors have characteristics which largely vary from pixel to pixel. In order to employ the current drive method, a correction circuit which corrects characteristic variation is needed. When the EL display device is manufactured by a manufacturing method including a manufacturing process of an SOI substrate and a gettering step, the selecting transistor 401 and the display control transistor 402 do not have variation in electrical characteristics from pixel to pixel. Accordingly, the current drive method can be employed.

That is, various electronic devices can be manufactured by using SOI substrates. Examples of electronic devices include: cameras such as video cameras and digital cameras; navigation systems; sound reproduction systems (car audio systems, audio components, and the like); computers; game machines; portable information terminals (mobile computers, cellular phones, portable game machines, electronic book readers, and the like); image reproduction devices provided with recording media (specifically, devices that are each capable of reproducing audio data stored in a recording medium such as a digital versatile disc (DVD) and that each have a display device capable of displaying image data stored therein); and the like.

Figure 12A:
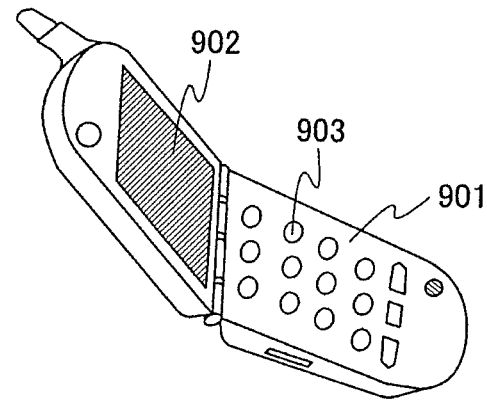
FIGS. 12A to 12C are diagrams each showing an electronic device using an SOI substrate of the present invention.

Specific modes of electronic devices are described with reference to FIGS. 12A to 12C. FIG. 12A shows an external view of an example of a cellular phone 901. This cellular phone 901 has a structure including a display portion 902, an operation switch 903, and the like. By applying the liquid crystal display device described with FIGS. 10A and 10B or the EL display device described with FIGS. 11A and 11B to the display portion 902, the display portion 902 can display high-quality images with little display unevenness.

Figure 12B:
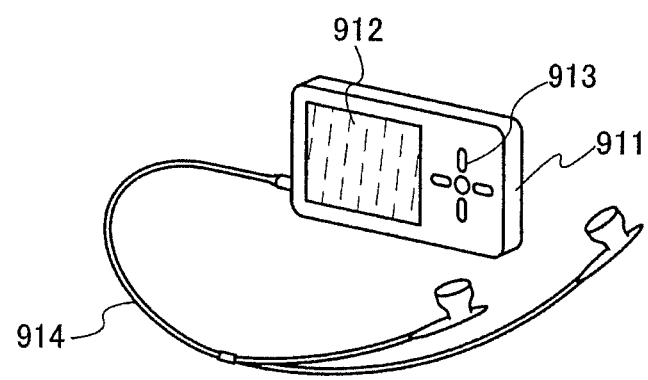

FIG. 12B shows an external view of an example of a structure of a digital player 911. The digital player 911 includes a display portion 912, an operation portion 913, an earpiece 914, and the like. Instead of the earpiece 914, headphones or a wireless earpiece can also be used. By applying the liquid crystal display device described with FIGS. 10A and 10B or the EL display device described with FIGS. 11A and 11B to the display portion 912, even in the case where the screen size is about 0.3 inches to 2 inches, the display portion 912 can display high-definition images and a large amount of text information.

Figure 12C:
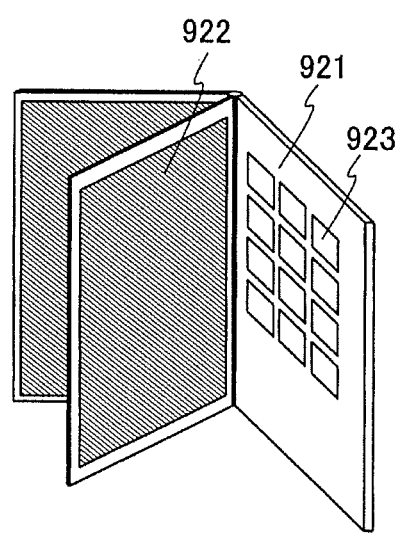
Figure 13A:
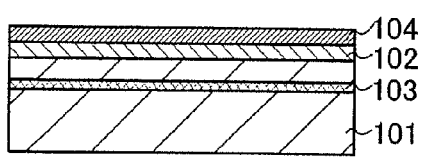
FIGS. 13A to 13D are schematic diagrams showing bonding between a semiconductor substrate provided with a nitrogen-containing layer and a base substrate.
Figure 13B:
Figure 13C:
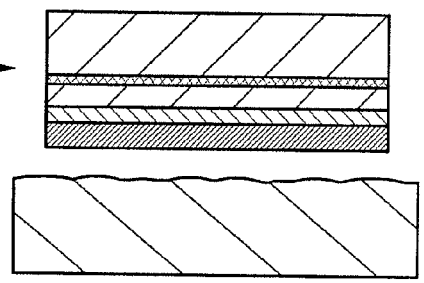
Figure 13D:
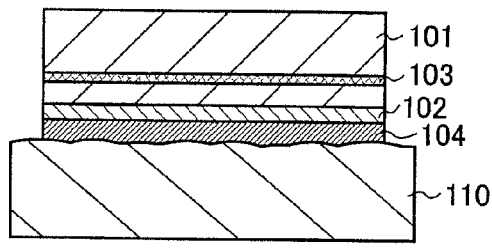

FIG. 12C shows an external view of an electronic book reader 921. This electronic book reader 921 includes a display portion 922 and an operation switch 923. A modem may be incorporated in the electronic book reader 921, or the RFCPU in FIG. 8 may be incorporated therein so that the electronic book reader 921 has a structure with which information can be transmitted and received wirelessly. By applying the liquid crystal display device described with FIGS. 10A and 10B or the EL display device described with FIGS. 11A and 11B to the display portion 922, the display portion 922 can display high-quality images.

[Embodiment 1]

In this embodiment, the relationship between surface roughness of a nitrogen-containing layer that is formed by a plasma CVD method and substrate temperature during film formation is described. Note that it is needless to say that the present invention is not limited by the following embodiments and is specified by the claims of the invention.

First, silicon nitride oxide films each having a thickness of about 200 nm were formed over single crystal silicon substrates by a plasma CVD method. Here, a plurality of different substrate temperatures (temperatures of substrates during film formation) were set, and silicon nitride oxide films were formed at the respective substrate temperatures. Next, surfaces of the silicon nitride oxide films formed at the different substrate temperatures were measured using an atomic force microscope (AFM). After that, the silicon nitride oxide films formed at the respective substrate temperatures were each used as a bonding layer to bond a single crystal silicon substrate and a glass substrate together, and their bonding conditions were observed.

Note that each of the silicon nitride oxide films was formed by plasma CVD under a pressure of 160 Pa in an atmosphere containing silane, nitrogen, and hydrogen ($SiH_4$: 14 sccm, $N_2O$: 20 sccm, $NH_3$: 150 sccm, and $H_2$: 500 sccm) at an RF frequency of 27.12 MHz with an RF power of 50 W and a distance between electrodes of 20 mm. The substrate temperatures were set based on the result of measuring a temperature of a reference glass substrate with a thermocouple. In other words, the term "substrate temperature" here can be regarded as temperature of a substrate during film formation.

The measurement with an AFM was performed using an apparatus (SPI3800N/SPA-500) manufactured by SII Nano-Technology Inc., and the measurement area was 1 μm×1 μm.

Bonding between a single crystal silicon substrate and a glass substrate with each of the silicon nitride oxide films used as a bonding layer was performed by holding edges (at one of four corners) of the two substrates superposed on each other between fingers so as to apply pressure thereto, thereby causing gradual automatic bonding from the substrate edges. Note that in this embodiment, bonding was performed using a glass substrate having a surface with an average surface roughness ($R_a$) of 0.3 nm or less.

Figure 14:
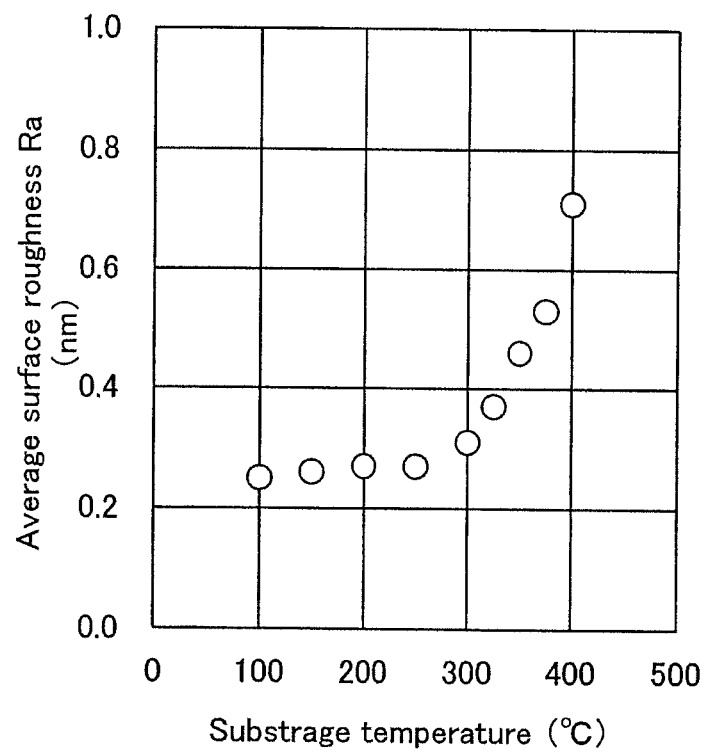
FIG. 14 is a diagram showing relationship between substrate temperature during film formation and average surface roughness of a surface of a silicon nitride oxide film.

Table 1 shows the results of surface measurement with an AFM of the silicon nitride oxide films formed at the respective substrate temperatures and their bonding conditions. FIG. 14 shows a plot of average surface roughnesses ($R_a$) of the surfaces of the silicon nitride oxide films formed at the respective substrate temperatures.

TABLE 1

| Substrate temperature | Ra [nm] | Rms [nm] | P-V [nm] | Bonding Condition |
|---|---|---|---|---|
| 100° C. | 0.25 | 0.32 | 2.61 | Good |
| 150° C. | 0.26 | 0.33 | 3.14 | Good |
| 200° C. | 0.27 | 0.34 | 3.03 | Good |
| 250° C. | 0.27 | 0.34 | 3.34 | Good |
| 300° C. | 0.31 | 0.39 | 3.73 | Good |
| 325° C. | 0.37 | 0.48 | 4.47 | Good |
| 350° C. | 0.46 | 0.58 | 5.06 | Not bad |
| 375° C. | 0.53 | 0.67 | 5.35 | Bad |
| 400° C. | 0.71 | 0.89 | 9.17 | Bad |

As shown in Table 1 and FIG. 14, it can be confirmed that a silicon nitride oxide film formed at a lower substrate temperature has a smaller surface roughness. In addition, a bonding condition is favorable when a silicon nitride oxide film has a surface with an average surface roughness ($R_a$) of 0.37 nm or less (when a substrate temperature during film formation is 325° C. or lower). Furthermore, when a substrate temperature during film formation is 250° C. or lower (when $R_a$ is 0.27 nm or less), there is less variation in average surface roughness in accordance with substrate temperature among surfaces of silicon nitride oxide films. On the other hand, it can be confirmed that a bonding condition is insufficient and defective bonding occurs when a silicon nitride oxide film has a surface with an average surface roughness of 0.53 nm or more (when a substrate temperature during film formation is 375° C. or higher). In addition, when a silicon nitride oxide film has a surface with an average surface roughness of 0.46 nm (when a substrate temperature during film formation is 350° C.), automatic bonding is slow, but defective bonding is not observed.

The above results show that a silicon nitride oxide film having a flat surface can be formed when a substrate temperature during film formation is low. In addition, it can be considered that defective bonding between a silicon substrate and a glass substrate can be suppressed when a silicon nitride oxide film which functions as a bonding layer has a surface with an average surface roughness ($R_a$) of at most 0.46 nm or less.

[Embodiment 2]

In this embodiment, the relationship between hydrogen content in a nitrogen-containing layer formed by a plasma CVD method and substrate temperature during film formation is described.

First, silicon nitride oxide films were formed over single crystal silicon substrates by a plasma CVD method. Here, a plurality of different substrate temperatures were set, and silicon nitride oxide films were formed at the respective substrate temperatures. Next, hydrogen contents (here, the amount of Si—H bonds and the amount of N—H bonds) in the silicon nitride oxide films formed at the different substrate temperatures were measured by Fourier transform infrared spectroscopy (FT-IR). Note that in this embodiment, FT-IR analyses were performed using an apparatus (Magna 560) manufactured by Thermo Fisher Scientific Inc. Note that the silicon nitride oxide films were formed by a plasma CVD method under similar conditions to those in Embodiment 1.

Figure 15A:
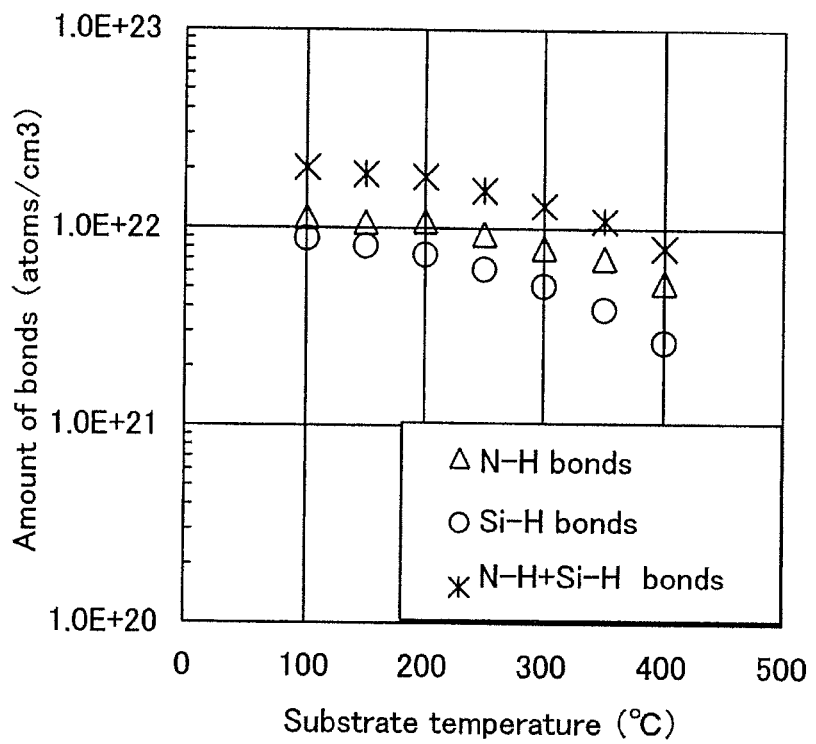
FIGS. 15A and 15B are diagrams showing relationship between substrate temperature during film formation and amount of Si—H and N—H bonds of a silicon nitride oxide film.
Figure 15B:
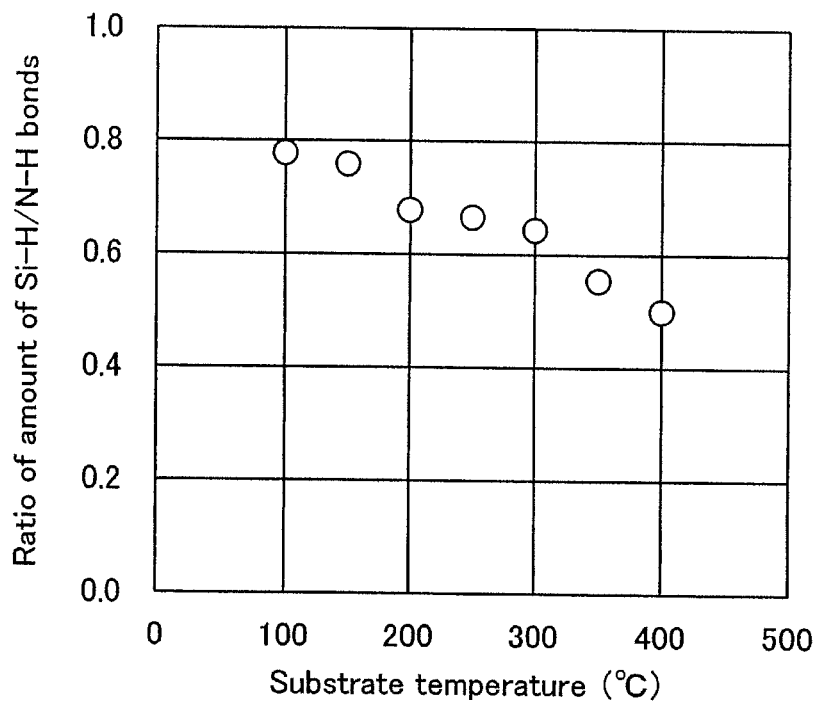

FIG. 15A shows the results of measurement of the amount of Si—H bonds and the amount of N—H bonds contained in the silicon nitride oxide films formed at the respective substrate temperatures. FIG. 15B shows the ratios of the amount of Si—H bonds to the amount of N—H bonds contained in the silicon nitride oxide films.

As the results in FIGS. 15A and 15B show, a silicon nitride oxide film formed at a lower substrate temperature contains a larger amount of Si—H bonds and N—H bonds. In addition, it can be observed that as a substrate temperature during film formation becomes lower, the ratio of the amount of Si—H bonds to the amount of N—H bonds contained in a silicon nitride oxide film becomes higher.

It can be confirmed from the above results that the content of hydrogen in a silicon nitride oxide film can be increased as a substrate temperature during film formation is lowered.

[Embodiment 3]

In this embodiment, film quality of a nitrogen-containing layer formed by a plasma CVD method is described.

First, silicon nitride oxide films were formed over single crystal silicon substrates by a plasma CVD method. Here, a plurality of different substrate temperatures were set, and silicon nitride oxide films were formed at the respective substrate temperatures. Next, etching rates and film hardnesses of the silicon nitride oxide films formed at the different substrate temperatures were measured before and after heat treatment. Note that the silicon nitride oxide films were formed by a plasma CVD method under similar conditions to those in Embodiment 1. Furthermore, the heat treatment was performed in a nitrogen atmosphere at 200° C. for two hours, and then at 600° C. for two hours.

In this embodiment, the silicon nitride oxide films were each etched using a high-purity buffered fluoric acid, LAL 500 (a mixed aqueous solution containing 7.13% $NH_4HF_2$ and 15.37% $NH_4F$) manufactured by STELLA CHEMIFA CORPORATION.

The hardnesses of the silicon nitride oxide films were evaluated by a nanoindentation method. For a nanoindentation method, an apparatus (Nano Indenter XP) manufactured by MTS Systems Corporation was used. Each of the silicon nitride oxide films formed at the respective substrate temperatures was measured at 15 points and the average value thereof was used for evaluation.

Figure 16A:
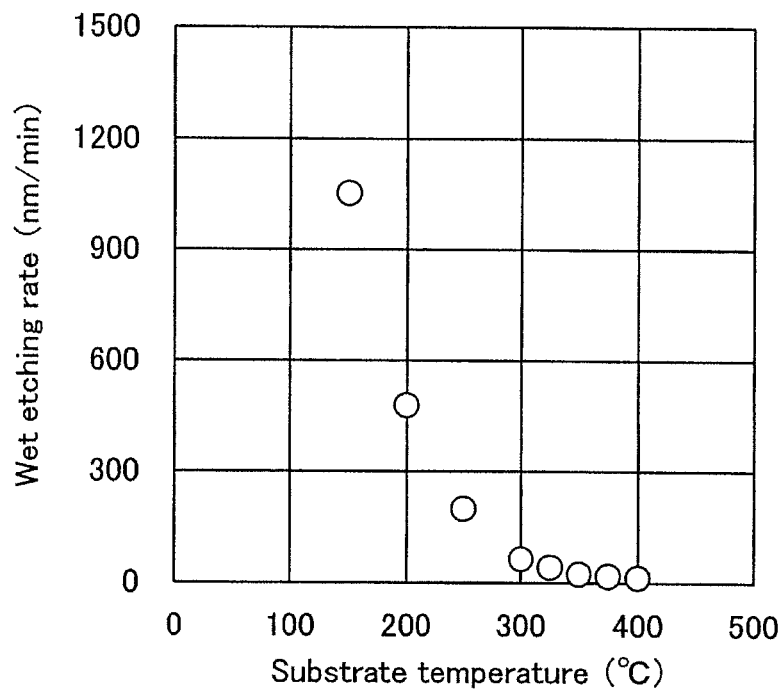
FIGS. 16A and 16B are schematic diagrams showing relationship between substrate temperature during film formation and etching rate of a silicon nitride oxide film.
Figure 16B:
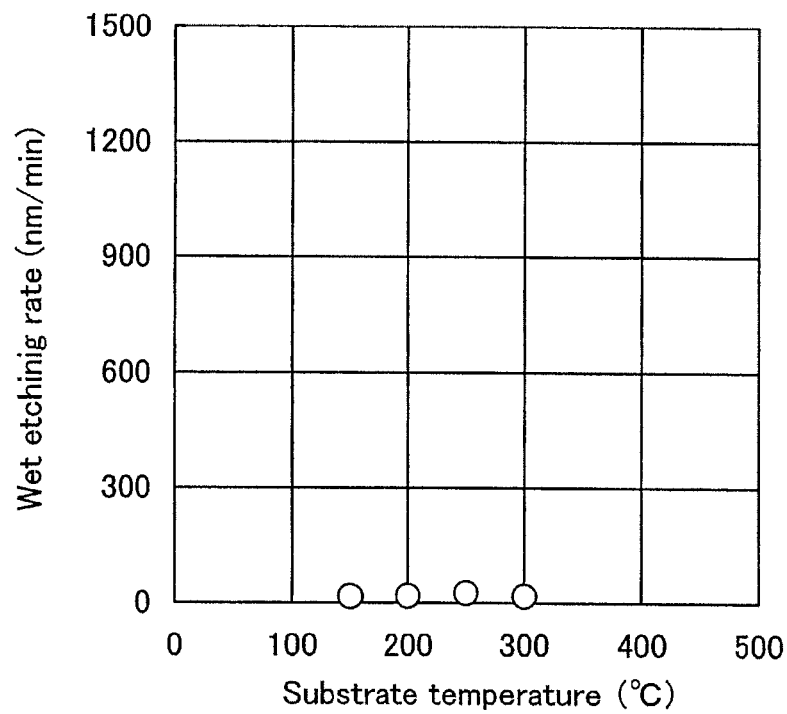

First, FIGS. 16A and 16B show etching rates before and after the heat treatment of the silicon nitride oxide films formed at the respective substrate temperatures. Note that FIG. 16A shows the etching rates before the heat treatment of the silicon nitride oxide films, and FIG. 16B shows the etching rates after the heat treatment of the silicon nitride oxide films.

As a result of comparing the etching rates before the heat treatment of the silicon nitride oxide films formed at the respective substrate temperatures, it can be seen that the lower a substrate temperature at which a silicon nitride oxide film is formed is, the higher the etching rate of the film is (FIG. 16A). It can be observed that etching rate is gradually increased as the substrate temperature during film formation becomes equal to or lower than 350° C. and etching rate is drastically increased as the substrate temperature during film formation becomes equal to or lower than 300° C.

As a result of comparing the etching rates after the heat treatment of the silicon nitride oxide films formed at the respective substrate temperatures, it can be seen that the etching rates of the silicon nitride oxide films do not vary regardless of substrate temperature during film formation and the etching rates are low (FIG. 16B).

It can be considered from FIGS. 16A and 16B that etching rate of a silicon nitride oxide film before heat treatment becomes higher and density thereof becomes lower as a substrate temperature during film formation becomes lower. On the other hand, it can be considered that a densified silicon nitride oxide film can be obtained by heat treatment regardless of substrate temperature during film formation.

Figure 17A:
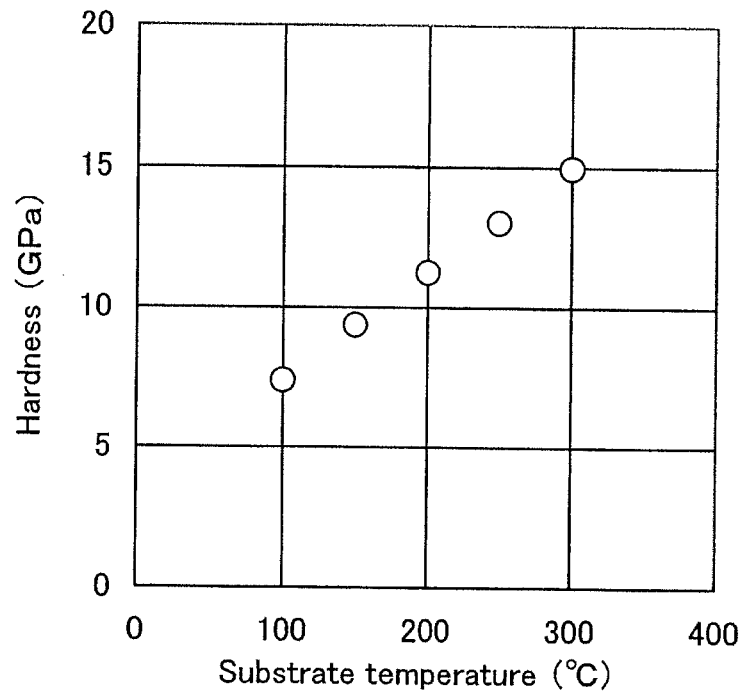
FIGS. 17A and 17B are diagrams showing relationship between substrate temperature during film formation and hardness of a silicon nitride oxide film.
Figure 17B:
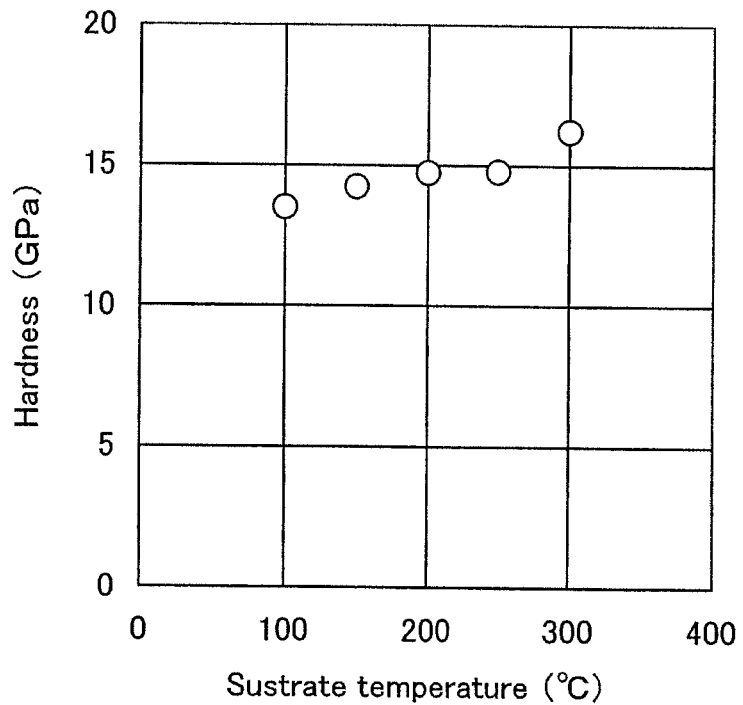

Next, FIGS. 17A and 17B show hardnesses before and after the heat treatment of the silicon nitride oxide films formed at the respective substrate temperatures. Note that FIG. 17A shows the hardnesses of the silicon nitride oxide films before the heat treatment, and FIG. 17B shows the hardnesses of the silicon nitride oxide films after the heat treatment.

As a result of comparing the hardnesses before the heat treatment of the silicon nitride oxide films formed at the respective substrate temperatures, it can be seen that the lower a substrate temperature at which a silicon nitride oxide film is formed is, the lower the hardness of the silicon nitride oxide film is (the softer the film is) (FIG. 17A).

As a result of comparing the hardnesses after the heat treatment of the silicon nitride oxide films formed at the respective substrate temperatures, it can be seen that the influence of substrate temperature during film formation is small and a silicon nitride oxide film having a certain level of hardness can be obtained by heat treatment at any of the substrate temperatures (FIG. 17B).

It can be said from the results of FIGS. 17A and 17B that a silicon nitride oxide film before heat treatment becomes softer as a substrate temperature during film formation becomes lower. On the other hand, it can be said that a silicon nitride oxide film having a certain level of hardness can be obtained by heat treatment regardless of substrate temperature during film formation.

[Embodiment 4]

In this embodiment, a barrier property of a nitrogen-containing layer formed by a plasma CVD method against impurities is described.

First, silicon nitride oxide films were formed over glass substrates by a plasma CVD method. Here, a plurality of different substrate temperatures were set, and silicon nitride oxide films were formed at the respective substrate temperatures. Next, the silicon nitride oxide films formed at the different substrate temperatures were subjected to heat treatment, and then, concentrations of sodium (Na) in the silicon nitride oxide films after the heat treatment were measured. Note that the silicon nitride oxide films were formed by a plasma CVD method under similar conditions to those in Embodiment 1. Furthermore, the heat treatment was performed in a nitrogen atmosphere at 200° C. for two hours, and then at 600° C. for two hours.

In this embodiment, the concentrations of sodium in the silicon nitride oxide films were measured by secondary ion mass spectrometry (SIMS).

Figure 18:
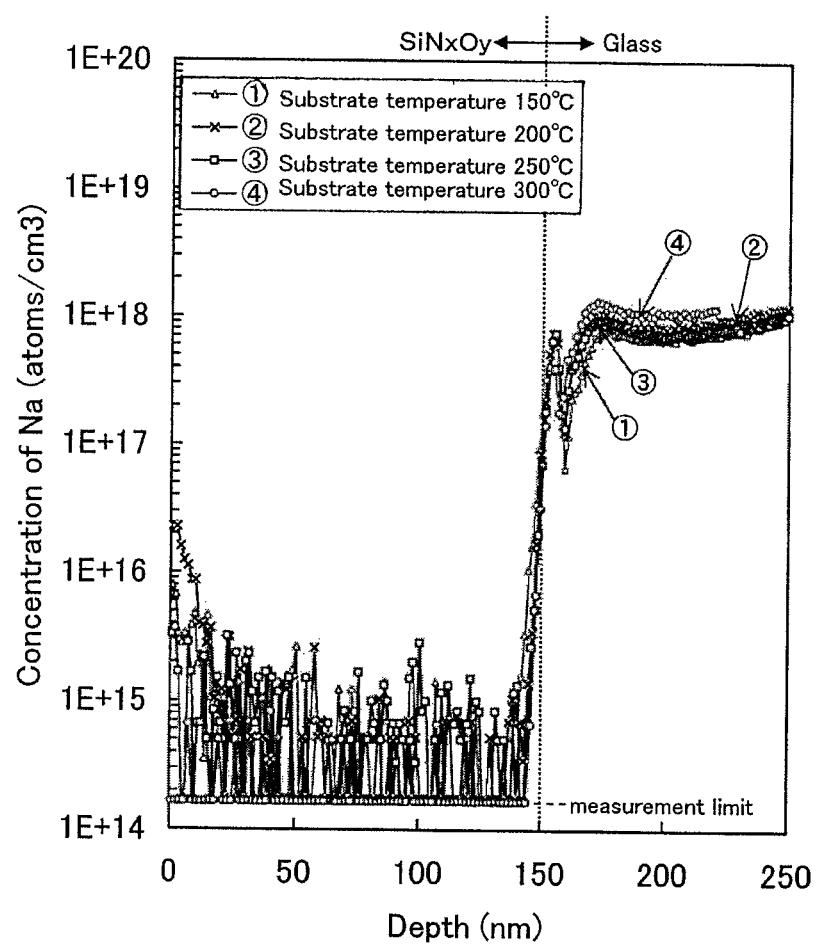
FIG. 18 is a schematic diagram showing relationship between substrate temperature during film formation and concentration of Na after heat treatment.

FIG. 18 shows the results of measurement of the concentrations of sodium in the silicon nitride oxide films formed at the respective substrate temperatures and then subjected to heat treatment.

FIG. 18 shows that the glass substrates each contain sodium at $1 \times 10^{18}$ atoms/cm$^3$, whereas the concentrations of sodium in the silicon nitride oxide films formed in contact with the glass substrates are equal to or below the measurement limit of the SIMS analysis regardless of the substrate temperatures during film formation of the silicon nitride oxide films.

It can be confirmed from the above results that even when heat treatment is performed, a silicon nitride oxide film functions as a barrier layer which prevents sodium from diffusing from a glass substrate regardless of substrate temperature during film formation.

This application is based on Japanese Patent Application serial no. 2007-283669 filed with Japan Patent Office on Oct. 31, 2007, the entire contents of which are hereby incorporated by reference.

What is claimed is:

1. A method for manufacturing an SOI substrate, comprising the steps of:
    forming an oxide film over a semiconductor substrate;
    forming a nitrogen-containing layer over the oxide film;
    irradiating the semiconductor substrate with accelerated ions through the oxide film and the nitrogen-containing layer to form a separation layer at a predetermined depth from a surface of the semiconductor substrate;
    disposing the semiconductor substrate and a base substrate opposite to each other to bond a surface of the nitrogen-containing layer and a surface of the base substrate to each other; and
    heating the semiconductor substrate to cause separation along the separation layer, thereby forming a single crystal semiconductor layer over the base substrate with the oxide film and the nitrogen-containing layer interposed therebetween,
    wherein a glass substrate having a surface with an average surface roughness of 0.3 nm or less is used as the base substrate.

2. A method for manufacturing an SOI substrate, comprising the steps of:
    irradiating a semiconductor substrate with accelerated ions to form a separation layer at a predetermined depth from a surface of the semiconductor substrate;
    forming an oxide film over the semiconductor substrate;
    forming a nitrogen-containing layer over the oxide film;
    disposing the semiconductor substrate and a base substrate opposite to each other to bond a surface of the nitrogen-containing layer and a surface of the base substrate to each other; and
    heating the semiconductor substrate to cause separation along the separation layer, thereby forming a single crystal semiconductor layer over the base substrate with the oxide film and the nitrogen-containing layer interposed therebetween,
    wherein a glass substrate having a surface with an average surface roughness of 0.3 nm or less is used as the base substrate.

3. The method for manufacturing an SOI substrate according to claim 1, wherein the nitrogen-containing layer is formed by a plasma CVD method with introduction of a hydrogen gas at a substrate temperature equal to or higher than room temperature and equal to or lower than 350° C.

4. The method for manufacturing an SOI substrate according to claim 2, wherein the nitrogen-containing layer is formed by a plasma CVD method with introduction of a hydrogen gas at a substrate temperature equal to or higher than room temperature and equal to or lower than 350° C.

5. The method for manufacturing an SOI substrate according to claim 3, wherein the plasma CVD method is performed with introduction of a silane gas and an ammonia gas in addition to the hydrogen gas.

6. The method for manufacturing an SOI substrate according to claim 4, wherein the plasma CVD method is performed with introduction of a silane gas and an ammonia gas in addition to the hydrogen gas.

7. The method for manufacturing an SOI substrate according to claim 1, wherein the oxide film is formed by thermal oxidation treatment of the semiconductor substrate in an oxidizing atmosphere containing hydrogen chloride.

8. The method for manufacturing an SOI substrate according to claim 2, wherein the oxide film is formed by thermal oxidation treatment of the semiconductor substrate in an oxidizing atmosphere containing hydrogen chloride.

9. The method for manufacturing an SOI substrate according to claim 1 further comprising performing pressurization treatment with a heat treatment after bonding the surface of the oxide film and the surface of the nitrogen-containing layer to each other.

10. The method for manufacturing an SOI substrate according to claim 2 further comprising performing pressurization treatment with a heat treatment after bonding the surface of the oxide film and the surface of the nitrogen-containing layer to each other.

11. The method for manufacturing an SOI substrate according to claim 1, wherein a single crystal silicon substrate is used as the semiconductor substrate.

12. The method for manufacturing an SOI substrate according to claim 2, wherein a single crystal silicon substrate is used as the semiconductor substrate.

* * * * *